(12) United States Patent
Suzuki et al.

(10) Patent No.: US 10,330,928 B2
(45) Date of Patent: Jun. 25, 2019

(54) LIGHTING LENS, IMAGE PICKUP MODULE, AND ELECTRONIC APPARATUS

(71) Applicant: SONY CORPORATION, Tokyo (JP)

(72) Inventors: Mamoru Suzuki, Kanagawa (JP); Yusuke Oyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/531,908

(22) PCT Filed: Oct. 27, 2015

(86) PCT No.: PCT/JP2015/080192
§ 371 (c)(1),
(2) Date: May 31, 2017

(87) PCT Pub. No.: WO2016/092961
PCT Pub. Date: Jun. 16, 2016

(65) Prior Publication Data
US 2017/0269356 A1 Sep. 21, 2017

(30) Foreign Application Priority Data
Dec. 11, 2014 (JP) .................. 2014-251123

(51) Int. Cl.
*G02B 9/00* (2006.01)
*G02B 9/08* (2006.01)
(Continued)

(52) U.S. Cl.
CPC ......... *G02B 27/0025* (2013.01); *G03B 15/05* (2013.01); *H01L 27/14625* (2013.01);
(Continued)

(58) Field of Classification Search
CPC .......... G02B 27/0025; H01L 27/14625; G03B 11/04; G03B 15/05; G03B 17/00;
(Continued)

(56) References Cited

U.S. PATENT DOCUMENTS 9,575,392 B2 * 2/2017 Hooton .................. G03B 15/03

FOREIGN PATENT DOCUMENTS

| JP | 10-319297 A | 12/1998 |
|----|----|----|
| JP | 2006-121522 A | 5/2006 |

(Continued)

OTHER PUBLICATIONS

International Search Report prepared by the Japan Patent Office dated Jan. 19, 2016, for International Application No. PCT/JP2015/080192.

*Primary Examiner* — Alicia M Harrington
(74) *Attorney, Agent, or Firm* — Sheridan Ross P.C.

(57) ABSTRACT

Provided is an illumination lens, including: a lens portion provided in a substantially central portion of a plate surface of a plate-like member; a flat portion provided in a region other than a region of the lens portion of the plate surface; and a reflection suppression structure configured to suppress total reflection of light inside, the reflection suppression structure being provided in at least one of the flat portion and a side end portion. The illumination lens enables emitting light having a more favorable characteristic with a simpler configuration.

20 Claims, 28 Drawing Sheets

(51) Int. Cl.
*G02B 27/00* (2006.01)
*G03B 15/05* (2006.01)
*H01L 27/146* (2006.01)
*H04N 5/225* (2006.01)
*G03B 17/02* (2006.01)
*F21K 5/06* (2006.01)

(52) U.S. Cl.
CPC ......... *H04N 5/2254* (2013.01); *H04N 5/2256* (2013.01); *G03B 15/0442* (2013.01); *G03B 17/02* (2013.01); *G03B 2215/0503* (2013.01); *G03B 2215/0567* (2013.01)

(58) Field of Classification Search
CPC ............. G03B 17/566; G06K 9/00228; G06K 2009/4666; G06K 2209/03; G06K 7/06; G06K 7/1413; G06K 9/00295; G06K 9/00355; G06K 9/00362
See application file for complete search history.

(56) References Cited

FOREIGN PATENT DOCUMENTS

| | | |
|---|---|---|
| JP | 2010-238837 | 3/2009 |
| JP | 2009-517722 A | 4/2009 |
| JP | 2013-214268 A | 10/2013 |

\* cited by examiner

FIG. 5
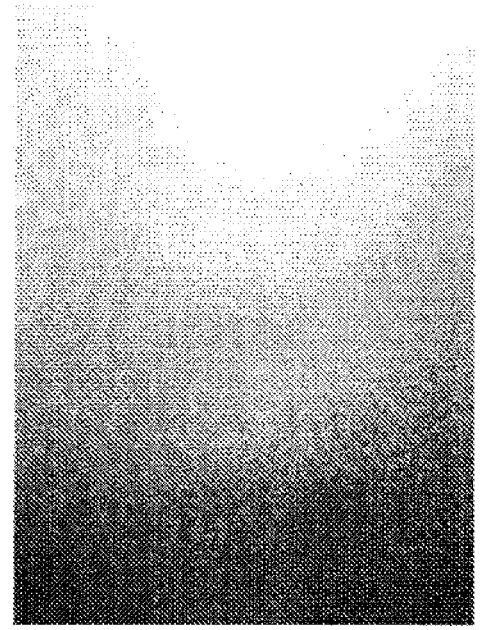
(b)
(a) PRIOR ART

LIGHTING LENS, IMAGE PICKUP MODULE, AND ELECTRONIC APPARATUS

CROSS REFERENCE TO RELATED APPLICATIONS

This application is a national stage application under 35 U.S.C. 371 and claims the benefit of PCT Application No. PCT/JP2015/080192 having an international filing date of 27 Oct. 2015, which designated the United States, which PCT application claimed the benefit of Japanese Patent Application No. 2014-251123 filed 11 Dec. 2014, the disclosures of which are incorporated herein by reference in their entirety.

TECHNICAL FIELD

The present disclosure relates to an illumination lens, an image pickup module, and an electronic apparatus.

BACKGROUND ART

In recent years, electronic apparatuses (hereinafter, also referred to as "mobile devices") carried by users, such as smartphones and tablet PCs, in which an image pickup module for capturing a still image and/or a moving image is mounted, have been increased. The image pickup module includes a camera unit having an image pickup function and an illumination unit functioning as a flash light source for capturing an image.

In the image pickup module, it is important to improve a characteristic of irradiation light from the illumination unit in order to obtain a higher-quality captured image. As a technique for improving the characteristic of the irradiation light, for example, Patent Literature 1 discloses a light source module for a flash light source including a light source such as an LED, a reflecting member arranged to surround an emission direction of light from the light source while being spread in the emission direction, and a diffusing member and a light-concentrating member arranged on an optical path of the emitted light from the light source. According to the technique disclosed in Patent Literature 1, emitted light from the light source is emitted toward the outside via the diffusing member and the light-concentrating member, and therefore generation of luminance unevenness and illuminance unevenness in irradiation light, which is caused by the light source, can be suppressed.

CITATION LIST

Patent Literature

Patent Literature 1: JP 2010-238837A

DISCLOSURE OF INVENTION

Technical Problem

Herein, the light source module disclosed in Patent Literature 1 cited above is configured so that the reflecting member, the diffusing member, and the light-concentrating member are arranged in this order in the emission direction of light from the light source, and therefore it cannot be necessarily said that this configuration is a simple configuration. Meanwhile, regarding a mobile device in which an image pickup module is mounted, reduction in a manufacturing cost thereof and further reduction in size and weight thereof are required. Therefore, regarding the illumination unit of the image pickup module, a technique capable of emitting light having a more favorable characteristic with a simpler configuration is required.

In view of this, the present disclosure proposes an illumination lens, an image pickup module, and an electronic apparatus, each of which is new, improved, and capable of emitting light having a more favorable characteristic with a simpler configuration.

Solution to Problem

According to the present disclosure, there is provided an illumination lens including: a lens portion provided in a substantially central portion of a plate surface of a plate-like member; a flat portion provided in a region other than a region of the lens portion of the plate surface; and a reflection suppression structure configured to suppress total reflection of light inside, the reflection suppression structure being provided in at least one of the flat portion and a side end portion.

In addition, according to the present disclosure, there is provided an image pickup module, including: an illumination unit that includes a light source and an illumination lens and that is arranged on a rear cover so that emitted light from the light source passes through the illumination lens and the rear cover and is emitted toward the outside; and a camera unit provided so that an objective lens faces the rear cover on a same surface as a surface of the rear cover on which the illumination unit is provided. The illumination lens includes a lens portion provided in a substantially central portion of a plate surface of a plate-like member, a flat portion provided in a region other than a region of the lens portion of the plate surface, and a reflection suppression structure configured to suppress total reflection of light inside, the reflection suppression structure being provided in at least one of the flat portion and a side end portion.

In addition, according to the present disclosure, there is provided an electronic apparatus including an image pickup module. The image pickup module includes an illumination unit that includes a light source and an illumination lens and that is arranged on a rear cover so that emitted light from the light source is transmitted through the illumination lens and the rear cover and is emitted toward the outside, and a camera unit provided so that an objective lens of light faces the rear cover on a same surface as a surface of the rear cover on which the illumination unit is provided. The illumination lens includes a lens portion provided in a substantially central portion of a plate surface of a plate-like member, a flat portion provided in a region other than a region of the lens portion of the plate surface, and a reflection suppression structure configured to suppress total reflection of light inside, the reflection suppression structure being provided in at least one of the flat portion and a side end portion.

According to the present disclosure, the reflection suppression structure for suppressing total reflection of light inside is provided in at least one of the flat portion and the side end portion of the illumination lens. Herein, light that is totally reflected inside the illumination lens while being totally reflected repeatedly on the flat portion and the side end portion of the illumination lens is light departing from the original intention of the design and is light that may reduce a characteristic of irradiation light from the illumination lens. In the present disclosure, the reflection suppression structure is provided to suppress total reflection of light in the illumination lens, and therefore it is possible to suppress generation of such unintentional light and improve the characteristic of the irradiation light from the illumination lens. Further, the reflection suppression structure has a comparatively simple configuration that can be provided on the flat portion and/or the side end portion of the illumination lens, and therefore, according to the present disclosure, it is possible to emit light having a more favorable characteristic with a simpler configuration.

Advantageous Effects of Invention

As described above, according to the present disclosure, it is possible to emit light having a more favorable characteristic with a simpler configuration. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 5 shows captured images obtained by a general image pickup module in the experiment environment shown in FIG. 4 in a case where an illumination unit is not driven and in a case where the illumination unit is driven.

MODE(S) FOR CARRYING OUT THE INVENTION

Figure 1:
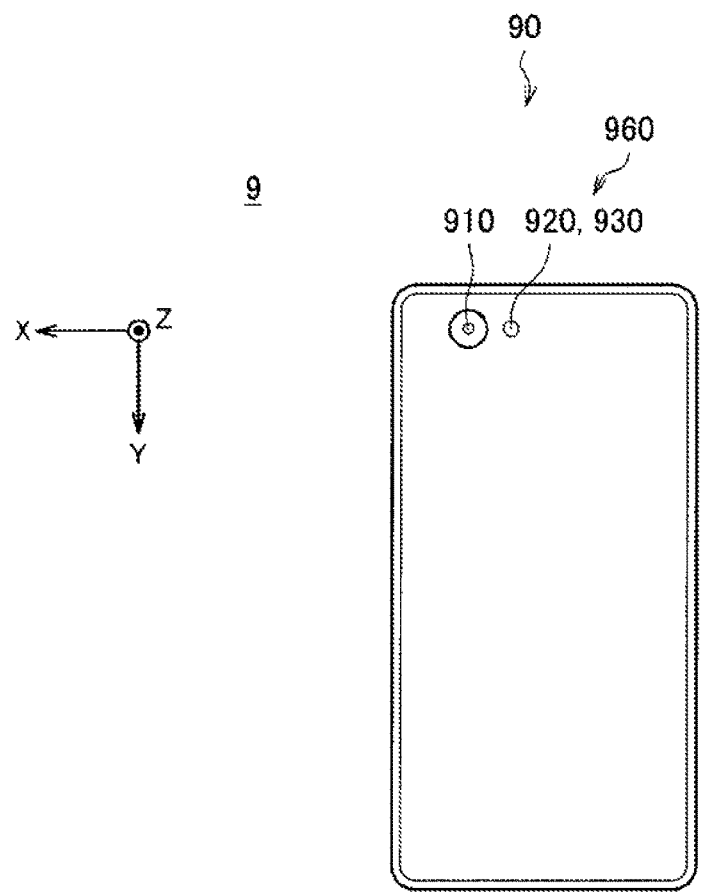
FIG. 1 shows an example of an electronic apparatus in which a general image pickup module is mounted.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Note that description will be provided in the following order.

1. Study of general image pickup module
1-1. Configuration of general image pickup module
1-2. Flash stray light
1-3. General flash-stray-light suppression structure
1-4. Study of flash stray light
1-5. Summary of study results
2. First Embodiment
2-1. Configuration of image pickup module
2-2. Configuration of illumination lens
3. Second Embodiment
4. Third Embodiment
5. Fourth Embodiment
6. Fifth Embodiment
7. Sixth Embodiment
8. Seventh Embodiment
9. Supplement 1. Study of General Image Pickup Module (1-1. Configuration of General Image Pickup Module)

In order to make the present disclosure clearer, results of study of an existing general image pickup module by the inventors of the present invention will be described and a background in which the inventors of the present invention have arrived the present disclosure will be described before description of preferred embodiments of the present disclosure.

Figure 2:
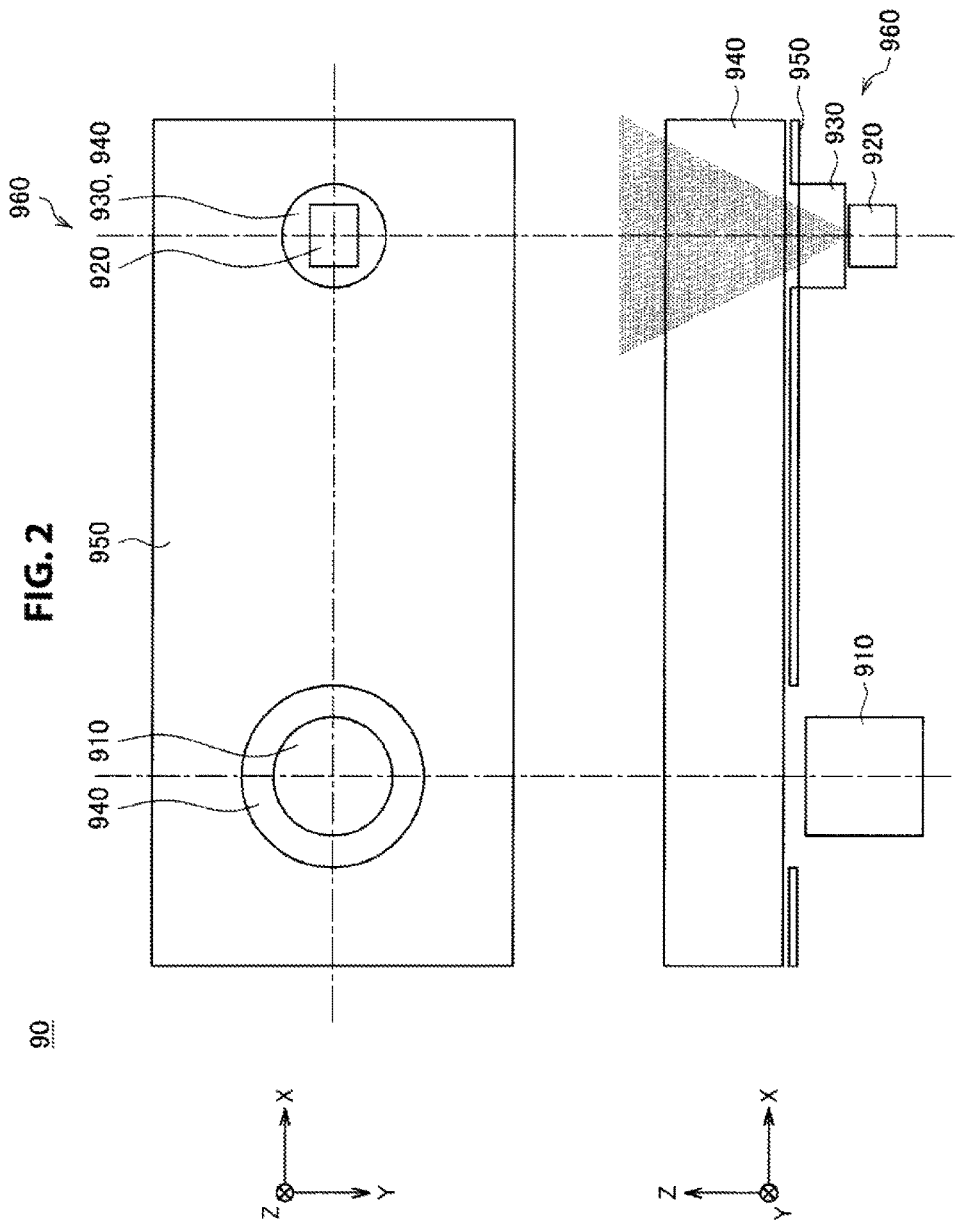
FIG. 2 shows a configuration example of a general image pickup module.

A configuration of a general image pickup module will be described with reference to FIG. 1 and FIG. 2. FIG. 1 shows an example of an electronic apparatus in which the general image pickup module is mounted. FIG. 2 shows a configuration example of the general image pickup module.

As shown in FIG. 1, a general image pickup module 90 is arranged in a housing of an electronic apparatus 9 so that at least a part of a camera unit 910 and at least a part of an illumination unit 960 are exposed via a rear cover 940 described below through a first opening and a second opening provided in a partition wall of the housing of the electronic apparatus 9. The image pickup module 90 can be mounted on, for example, an electronic apparatus (mobile device) carried by a user, such as a smartphone and a tablet PC. FIG. 1 shows a smartphone as an example of the electronic apparatus 9 on which the image pickup module 90 can be mounted.

An objective lens of the camera unit 910 is exposed in the first opening, and light from a subject is incident on the camera unit 910 through the objective lens via the first opening. The light from the subject is received by an image pickup element of the camera unit 910 via the objective lens, and therefore an image of the subject is captured. Note that not only the objective lens but also various optical elements such as other lenses may be provided inside the camera unit 910 as appropriate. The light from the subject is concentrated in the image pickup element via those optical elements.

The illumination unit 960 functions as a flash light source, and, at the time of capturing an image with a flash, emitted light from a light source 920 of the illumination unit 960 is output via an illumination lens 930 through the second opening.

Herein, driving of the image pickup module 90 (i.e., the camera unit 910 and the illumination unit 960) can be controlled as appropriate by a control unit provided in the electronic apparatus 9. The control unit is configured by various processors and has a function of controlling operation of the electronic apparatus 9 including the image pickup module 90 in such a manner that the processors perform operation processing in accordance with a predetermined program. At the time of capturing an image with a flash, the illumination unit 960 is driven for a predetermined time period in accordance with control from the control unit, and therefore the subject is irradiated with light from the light source 920.

Note that, in the following description, an emission direction of light from the illumination unit 960 of the image pickup module 90 (direction vertical to the sheet in FIG. 1) is defined as a Z-axis direction. The emission direction of the light is a positive direction of a Z-axis. Hereinafter, the Z-axis direction is also referred to as "vertical direction". Further, two directions orthogonal to each other in a plane vertical to the Z-axis are defined as an X-axis direction and a Y-axis direction. Herein, a direction in which the camera unit 910 and the illumination unit 960 are arranged side by side in the image pickup module 90 is defined as an X-axis. Hereinafter, a direction parallel to an X-Y plane is also referred to as "side".

FIG. 2 shows a plan view (view seen from a negative direction of the Z-axis) of the image pickup module 90 in an upper part thereof and shows a side view (view seen from the Y-axis direction) in a lower part thereof. When referring to FIG. 2, the image pickup module 90 is configured such that the camera unit 910 and the illumination unit 960 are arranged side by side on one surface of the rear cover 940 that is a plate-like member.

The camera unit 910 is arranged so that the objective lens thereof (i.e., inlet port (not shown) of light) faces the rear cover 940.

The illumination unit 960 is made up of the light source 920 and the illumination lens 930. As the light source 920, various light sources that can isotropically emit light, such as a light emitting diode (LED), can be used. The illumination lens 930 has a function of converting emitted light from the light source 920 so that the light has a desired light distribution characteristic. The illumination lens 930 is made of a material transparent to at least light in a visible light band (hereinafter, also referred to as "transparent material"). The illumination lens 930 can be made of, for example, various resin materials or glass materials. Emitted light from the light source 920 passes through the illumination lens 930 to be incident on the rear cover 940.

The image pickup module 90 is assembled in the electronic apparatus 9 so that a surface of the rear cover 940 to which the camera unit 910 and the illumination unit 960 are not attached faces an inner wall of the housing of the electronic apparatus 9. The rear cover 940 is made of a transparent material, and light from the illumination unit 960 (i.e., emitted light from the light source 920) passes through the rear cover 940 and is emitted toward the outside through the second opening provided in the housing of the electronic apparatus 9. Further, light incident on the inside of the housing through the first opening provided in the housing of the electronic apparatus 9 passes through the rear cover 940 to reach the camera unit 910.

On the surface of the rear cover 940 to which the camera unit 910 and the illumination unit 960 are attached, a reflecting film 950 having a characteristic that reflects at least light in the visible light band is provided in a region other than a region in which the camera unit 910 and the illumination unit 960 are attached. The reflecting film 950 is provided by applying, for example, a coating having the above reflection characteristic to the rear cover 940. Provision of the reflecting film 950 suppresses leakage of light from the illumination unit 960, the light being guided through the rear cover 940, and external light incident on the inside of the housing of the electronic apparatus 9 through the first and second openings into the inside of the housing via the rear cover 940. Note that reflectivity of visible light in the reflecting film 950 does not necessarily need to be close to 100%, and the reflecting film 950 only needs to have a function of reflecting visible light even slightly.

Hereinabove, the configuration of the general image pickup module 90 has been described with reference to FIG. 1 and FIG. 2.

(1-2. Flash Stray Light)

Herein, in the image pickup module 90, light from the illumination unit 960 (i.e., emitted light from the light source 920) passes through the rear cover 940 and is emitted toward the outside through the second opening provided in the housing of the electronic apparatus 9 as described above. At this time, a part of components of the light from the illumination unit 960 is propagated in the rear cover 940 and is incident on the camera unit 910 in some cases. Hereinafter, in the light from the illumination unit 960, a component of light propagated in the rear cover 940, is referred to as "flash stray light".

Figure 3:
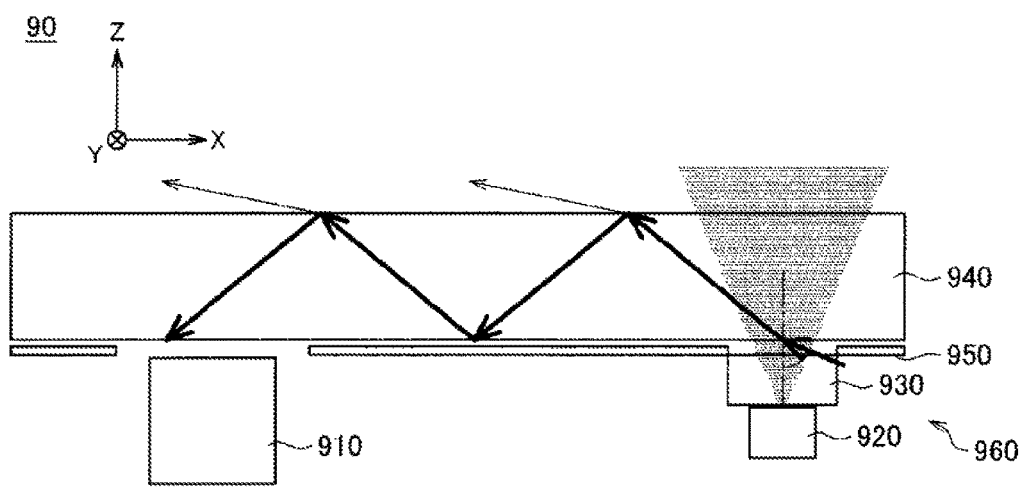
FIG. 3 is a diagram for explaining flash stray light.

Flash stray light will be described with reference to FIG. 3. FIG. 3 is a diagram for explaining flash stray light.

In FIG. 3, in the configuration of the image pickup module 90 shown in FIG. 2, light propagated in the rear cover 940 (i.e., flash stray light) in light emitted from the illumination unit 960 is indicated by a simulated arrow. As shown in FIG.

3, a part of light emitted from the illumination unit 960 may be propagated in the rear cover 940 toward the camera unit 910 as flash stray light.

At this time, a part of components of flash stray light is reflected on an upper surface of the rear cover 940 (surface positioning in the positive direction of the Z-axis) by Fresnel reflection, and remaining components are emitted toward the outside (in the air) through the rear cover 940. Further, the reflecting film 950 is provided on a lower surface of the rear cover 940 (surface positioning in the negative direction of the Z-axis), and therefore most of the flash stray light can be reflected on the lower surface.

In a case where the rear cover 940 is made of a transparent material and a configuration that shields light in the rear cover 940 does not exist as described above, a part of light emitted from the illumination unit 960 may become flash stray light by being propagated in the rear cover 940 while being repeatedly reflected on the upper surface and the lower surface of the rear cover 940. Although the flash stray light is gradually attenuated as the flash stray light is propagated in the rear cover 940, a part thereof may be incident on the camera unit 910 and may have an influence on a captured image thereof.

Figure 4:
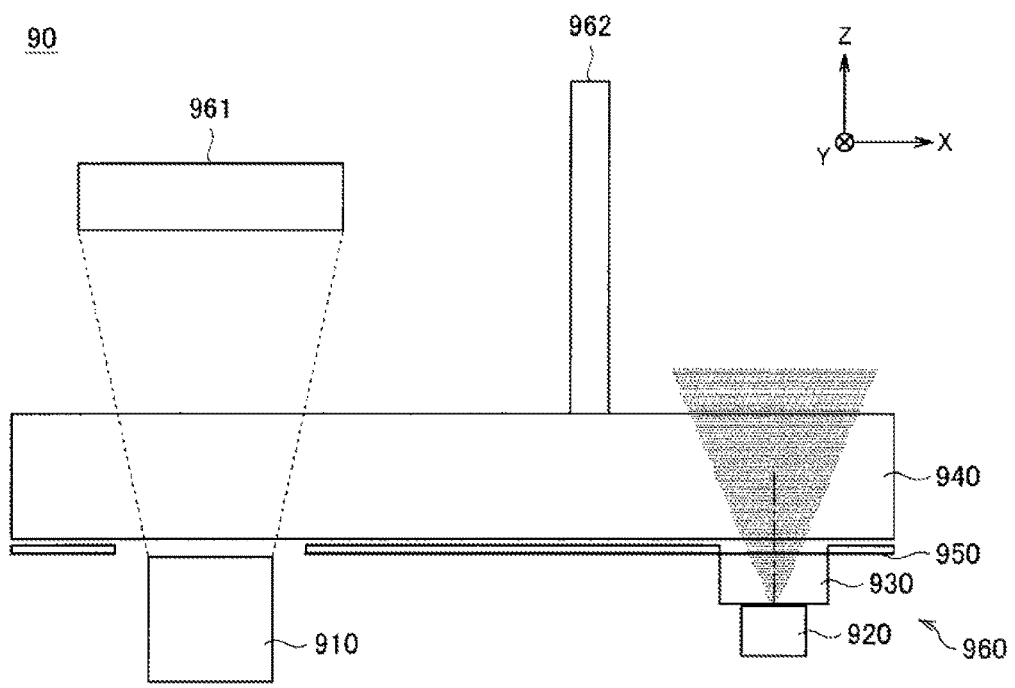
FIG. 4 is a diagram for explaining an experiment environment for examining an influence of flash stray light on a captured image at the time of capturing an image by using a general image pickup module.

The inventors of the present invention performed an experiment for examining an influence of such flash stray light on a captured image at the time of capturing an image by using the image pickup module 90. FIG. 4 shows an environment in which the experiment was performed. FIG. 4 is a diagram for explaining an experiment environment for examining an influence of flash stray light on a captured image at the time of capturing an image by using the general image pickup module 90.

In the experiment, an image of a black subject 961 was captured by the image pickup module 90 in a satisfactorily dark room in which, except for light emitted from the illumination unit 960, light detectable by the camera unit 910 hardly exists. At this time, in order to detect only flash stray light, a shielding plate 962 was provided between the camera unit 910 and the illumination unit 960 outside the image pickup module 90 as shown in FIG. 4. The shielding plate 962 is provided to prevent the subject 961 from being irradiated with emitted light from the illumination unit 960 emitted toward the outside of the image pickup module 90. In other words, in a case where an image is captured by driving the illumination unit 960 in a state in which the shielding plate 962 is provided, only light propagated in the rear cover 940 (i.e., flash stray light) in the emitted light from the illumination unit 960 is incident on the camera unit 910.

Images of the subject 961 were captured by the image pickup module 90 in a case where the illumination unit 960 was not driven and in a case where the illumination unit 960 was driven in the experiment environment shown in FIG. 4. Results thereof are shown in FIG. 5. FIG. 5 shows captured images obtained by the general image pickup module 90 in the experiment environment shown in FIG. 4 in a case where the illumination unit 960 was not driven and in a case where the illumination unit 960 was driven.

FIG. 5(a) shows a captured image obtained by the image pickup module 90 in a case where the illumination unit 960 was not driven. When referring to FIG. 5(a), in a case where the illumination unit 960 was not driven, the whole black captured image was obtained.

FIG. 5(b) shows a captured image obtained by the image pickup module 90 in a case where the illumination unit 960 was driven. When referring to FIG. 5(b), it is found that light was leaked into the captured image in a case where the illumination unit 960 was driven.

As described above, the subject 961 is prevented by the shielding plate 962 from being irradiated with emitted light from the illumination unit 960, the light being emitted toward the outside of the image pickup module 90, and therefore, even in a case where the illumination unit 960 is driven, the black captured image shown in FIG. 5(a) is supposed to be obtained unless flash stray light is incident on the camera unit 910. In other words, the result shown in FIG. 5(b) shows that, in the general image pickup module 90, flash stray light is considerably incident on the camera unit 910 and the flash stray light may have an influence on the captured image. The flash stray light is not light from the subject, which is to be originally detected, but is light unintentionally incident on the camera unit 910, and therefore there is a fear that the flash stray light reduces an image quality of a captured image at the time of capturing an image with a flash by driving the illumination unit 960.

(1-3. General Flash-Stray-Light Suppression Structure)

As is clear from the results of the experiment performed by the inventors of the present invention, there is a fear that, in the general image pickup module 90, flash stray light is incident on the camera unit 910 to reduce an image quality of a captured image. In view of this, various structures for suppressing an influence of flash stray light on a captured image (hereinafter, referred to as "flash-stray-light suppression structures") are proposed.

Figure 6:
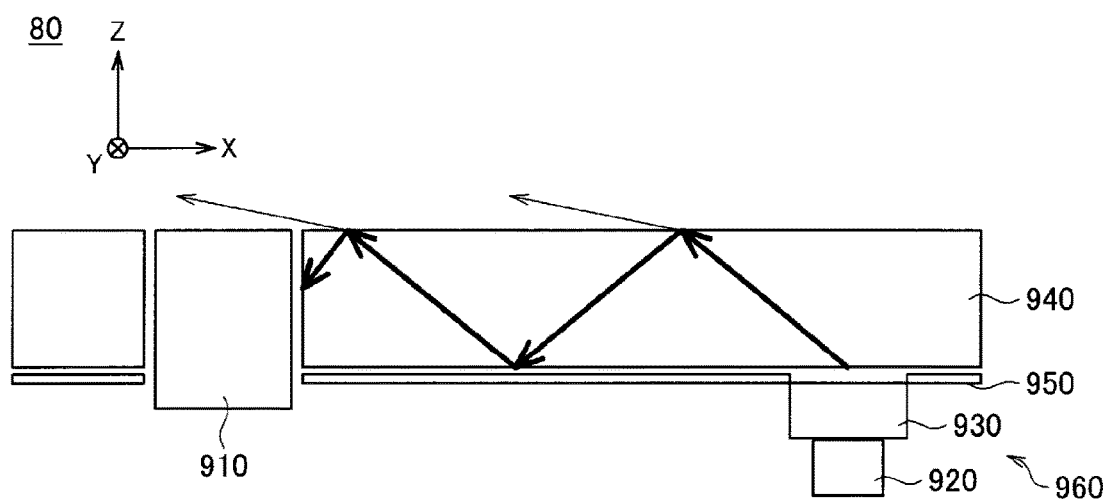
FIG. 6 shows a configuration example of a general image pickup module in which a flash-stray-light suppression structure is mounted.
Figure 7:
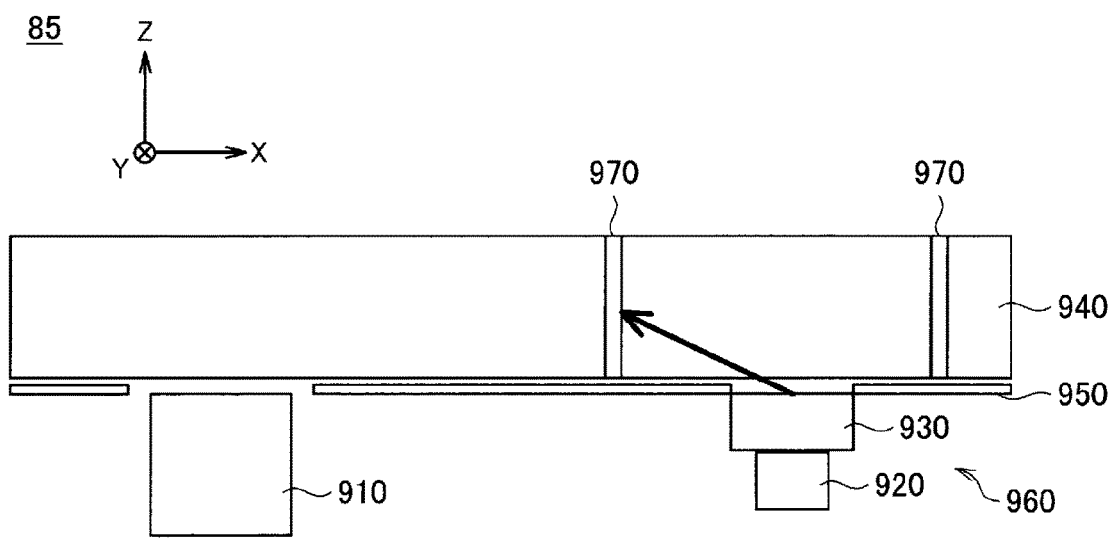
FIG. 7 shows another configuration example of a general image pickup module in which a flash-stray-light suppression structure is mounted.

FIG. 6 and FIG. 7 show configuration examples of existing general image pickup modules in each of which a flash-stray-light suppression structure is mounted. FIG. 6 shows a configuration example of a general image pickup module in which a flash-stray-light suppression structure is mounted. Further, FIG. 7 shows another configuration example of the general image pickup module in which the flash-stray-light suppression structure is mounted. Note that the image pickup modules shown in FIG. 6 and FIG. 7 correspond to image pickup modules in each of which a flash-stray-light suppression structure is added to the image pickup module 90 shown in FIG. 2, and therefore detailed description of the same configuration as that of the image pickup module 90 is omitted in the following description regarding the image pickup modules shown in FIG. 6 and FIG. 7.

When referring to FIG. 6, a structure in which the camera unit 910 is fit into an opening provided in the rear cover 940 is provided as the flash-stray-light suppression structure in a general image pickup module 80. In FIG. 6, as well as in FIG. 3, flash stray light is indicated by a simulated arrow. The above structure is provided, and therefore, in the image pickup module 80, even in a case where flash stray light is generated, the flash stray light does not reach the objective lens of the camera unit 910 as shown in FIG. 6. Therefore, according to the image pickup module 80, it is possible to reduce an influence of flash stray light on a captured image.

When referring to FIG. 7, a light shielding structure 970 is provided inside the rear cover 940 as the flash-stray-light suppression structure in a general image pickup module 85 having another configuration. The light shielding structure 970 is a plate-like member made of a material that shields, for example, at least light in a wavelength band corresponding to emitted light from the illumination unit 960 and is provided between the illumination unit 960 and the camera unit 910 inside the rear cover 940 as shown in FIG. 7. In FIG. 7, as well as in FIG. 3, flash stray light is indicated by a simulated arrow. As shown in FIG. 7, in the image pickup module 85, even in a case where flash stray light is generated, the flash stray light is shielded by the light shielding structure 970 and therefore does not reach the objective lens of the camera unit 910. Therefore, according to the image pickup module 85, it is possible to reduce an influence of flash stray light on a captured image.

Hereinabove, some configuration examples of a general image pickup module in which a flash-stray-light suppression structure is mounted have been described with reference to FIG. 6 and FIG. 7. As described above, it is possible to reduce an influence of flash stray light on a captured image by providing the flash-stray-light suppression structures shown in FIG. 6 and FIG. 7.

However, in order to provide the flash-stray-light suppression structures, the number of processes and the number of components are increased in a case where the image pickup modules 80 and 85 shown in FIG. 6 and FIG. 7 are prepared, as compared to a case where the image pickup module 90 shown in FIG. 2 is prepared, and thus an increase in manufacturing cost is concerned. Therefore, a simpler flash-stray-light suppression structure is desired.

Herein, as the simpler flash-stray-light suppression structure, there is considered a structure in which the illumination unit 960 and the camera unit 910 are arranged at positions satisfactorily apart from each other. Flash stray light is gradually attenuated as the flash stray light is propagated in the rear cover 940, and therefore, even in a case where flash stray light is incident on the camera unit 910, it is possible to suppress an influence thereof on a captured image by arranging the illumination unit 960 and the camera unit 910 at the positions satisfactorily apart from each other. However, in the structure, the center of an image capturing range using the camera unit 910 and the center of an irradiation range of light using the illumination unit 960 are greatly shifted from each other. Therefore, even in a case where reduction in an image quality of the captured image caused by the flash stray light can be suppressed, there is a fear that reduction in an image quality caused by a shift between the image capturing range and the irradiation range occurs.

(1-4. Study of Flash Stray Light)

In consideration of the results of study of the existing general image pickup modules described above, the inventors of the present invention further studied a simpler configuration that does not cause reduction in an image quality of a captured image caused by another factor. The inventors of the present invention analyzed in more detail a behavior of flash stray light serving as a factor that causes reduction in an image quality.

Figure 8:
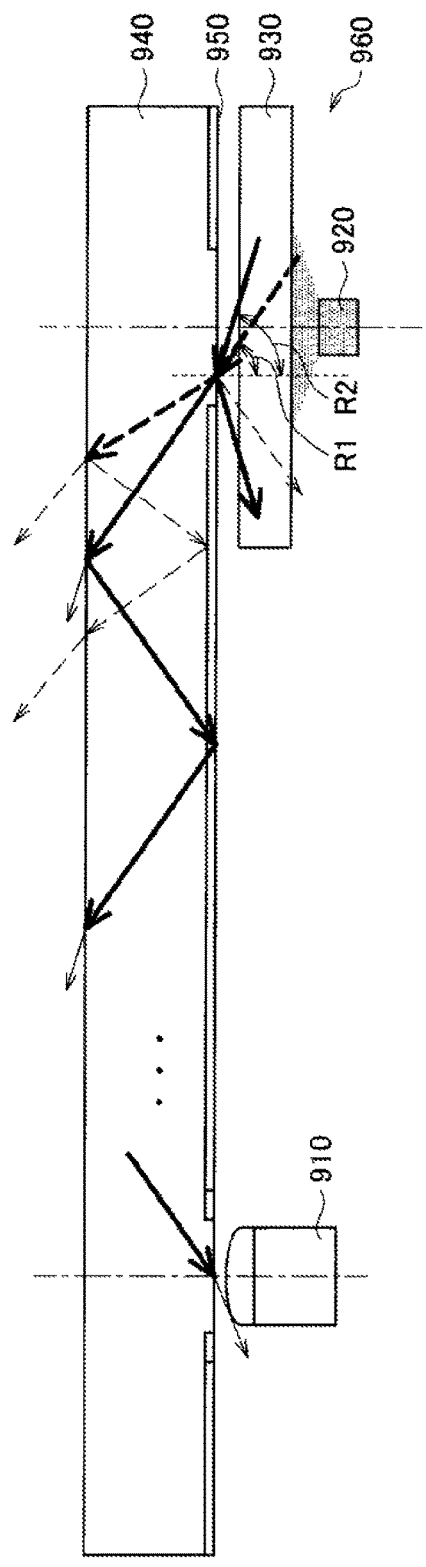
FIG. 8 is a diagram for explaining flash stray light in more detail.
Figure 9:
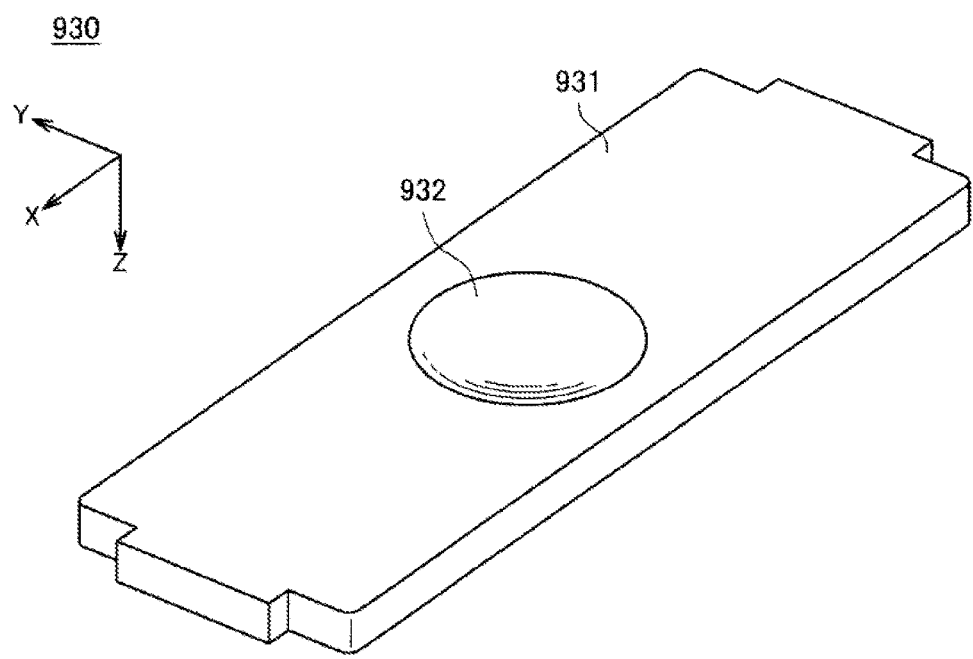
FIG. 9 is a perspective view showing a structure of a general illumination lens.
Figure 10:
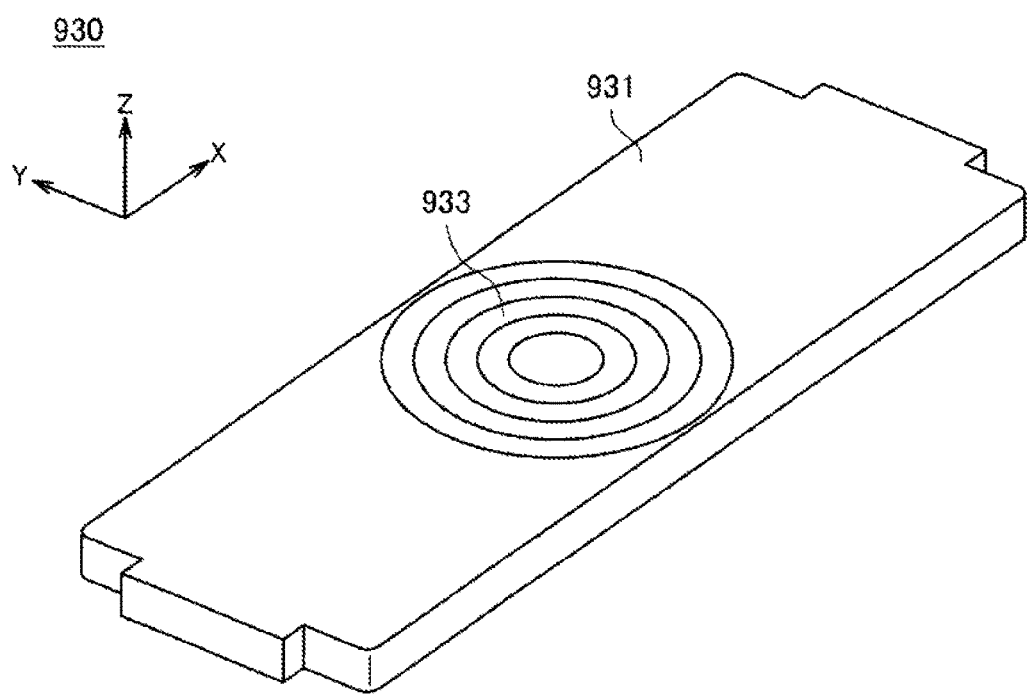
FIG. 10 is a perspective view showing a structure of a general illumination lens.

Results of a more detailed study that the inventors of the present invention performed on flash stray light will be described with reference to FIGS. 8 to 10. FIG. 8 is a diagram for explaining flash stray light in more detail. FIG. 9 and FIG. 10 are perspective views showing a structure of a general illumination lens 930.

In FIG. 8, as well as in FIG. 3, a state of propagation of flash stray light in the general image pickup module 90 is indicated by a simulated arrow. However, in FIG. 8, an optical path of flash stray light in the rear cover 940 is shown in more detail, as compared to FIG. 3. Further, in FIG. 8, states of propagation of two kinds of light in the rear cover 940, the two kinds of light having different angles of incidence on the rear cover 940, are indicated by arrows of different line types, respectively.

As shown in FIG. 8, light emitted from the light source 920 passes through the illumination lens 930 and is incident on the rear cover 940. Herein, the general illumination lens 930 has, for example, the structure shown in FIG. 9 and FIG. 10. FIG. 9 shows a state of the general illumination lens 930 seen from a lower surface side (side on which light from the light source 920 is incident), and FIG. 10 shows a state of the general illumination lens 930 seen from an upper surface side (side on which light from the light source 920 is emitted).

As shown in FIG. 9 and FIG. 10, the general illumination lens 930 is configured such that a lens portion is provided in a substantially central portion of the plate-like member. In a region of the illumination lens 930, the region being other than a region of the lens portion, a flat portion 931 that is substantially flat (i.e., thickness is substantially uniform) is provided. As shown in FIG. 9, a convex lens 932 is provided as the lens portion on a lower surface of the illumination lens 930. Further, as shown in FIG. 10, a Fresnel lens 933 is provided as the lens portion on an upper surface of the illumination lens 930.

Light emitted from the light source 920 is incident on the illumination lens 930 through the convex lens 932 on the lower surface of the illumination lens 930, is emitted through the Fresnel lens 933 on the upper surface of the illumination lens 930, and is incident on the rear cover 940. A light distribution characteristic of the emitted light is converted to a desired characteristic by causing the emitted light from the light source 920 to pass through the lens portion (i.e., the convex lens 932 and the Fresnel lens 933) of the illumination lens 930. In other words, an optical characteristic of the lens portion of the illumination lens 930 is designed so that the light distribution characteristic of the emitted light from the light source 920 is converted to a desired characteristic.

When a behavior of light emitted from the illumination lens 930 and incident on the rear cover 940 is studied in more detail, a part of components of light emitted from the illumination lens 930 is reflected by an interface between air and the rear cover 940 by Fresnel reflection, and remaining components thereof are incident on the rear cover 940. When the light incident on the inside of the rear cover 940 is emitted in the air through the rear cover 940 on the upper surface of the rear cover 940, a part of components thereof is reflected by Fresnel reflection to be propagated in the rear cover 940 and remaining components thereof are emitted in the air. The reflecting film 950 is provided on the lower surface of the rear cover 940, and therefore most of the light propagated in the rear cover 940 can be reflected on the lower surface. As a result, a part of light emitted from the illumination unit 960 may become flash stray light by being guided through the rear cover 940 while being repeatedly reflected on the upper surface and the lower surface of the rear cover 940.

Herein, in FIG. 8, states of propagation of two kinds of light in the rear cover 940, the two kinds of light having different angles of incidence on the rear cover 940, are indicated by arrows of different line types, respectively, as described above. As shown in FIG. 8, it is considered that light whose angle of incidence is R1 (light indicated by broken-line arrow) and light whose angle of incidence is R2 (light indicated by solid-line arrow) are different in an angle of incidence on the upper surface of the rear cover 940 and are therefore also different in reflectivity and transmittance on the upper surface. Therefore, there is a possibility that the angle of incidence R of light emitted from the illumination lens 930 on the rear cover 940 and a light amount (energy) of flash stray light incident on the camera unit 910 have some relationship.

Note that, in FIG. 8, the angle of incidence R of light on the rear cover 940 is defined as an angle to a thickness direction of the rear cover 940 (i.e., z-axis direction). That is, light having a larger angle of incidence R becomes light incident on the rear cover 940 from a direction parallel to a plate surface of the rear cover 940.

The inventors of the present invention performed the following analysis in order to examine the relationship between the angle of incidence R of light on the rear cover 940 and energy of flash stray light incident on the camera unit 910 described above. That is, the inventors of the present invention prepared a calculation model in which the configuration shown in FIG. 8 is simulated and calculated, by simulation, the energy of the flash stray light incident on the camera unit 910 at each angle of incidence R of light incident on the rear cover 940 from the illumination unit 960.

Figure 11:
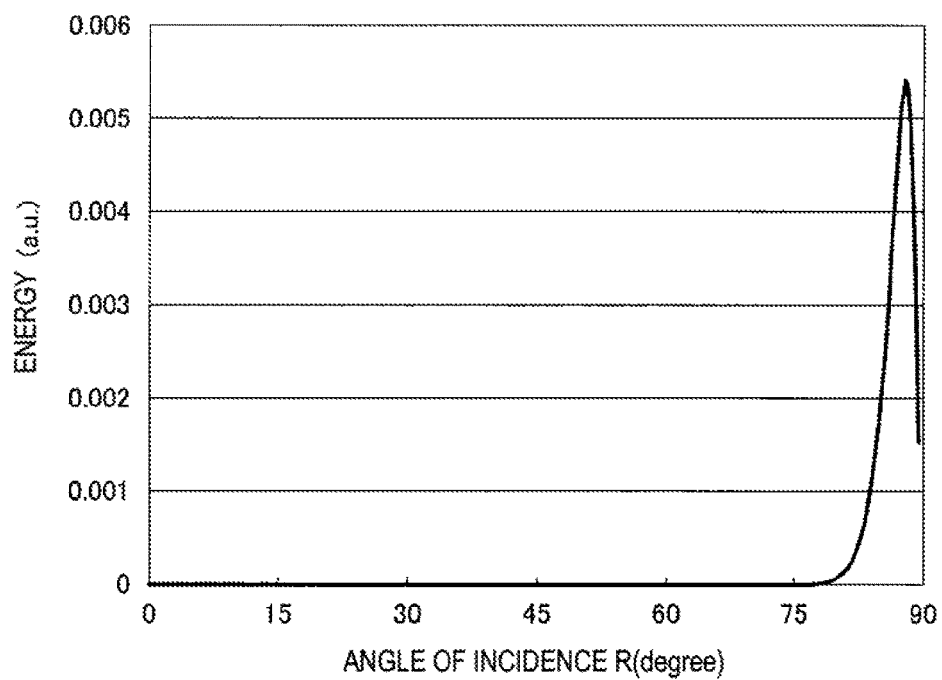
FIG. 11 is a graph showing a relationship between an angle of incidence R of light on a rear cover and energy of flash stray light incident on a camera unit in a general image pickup module.

A result of the calculation is shown in FIG. 11. FIG. 11 is a graph showing the relationship between the angle of incidence R of light on the rear cover 940 and the energy of the flash stray light incident on the camera unit 910 in the general image pickup module 90. In FIG. 11, the relationship therebetween is plotted by setting the angle of incidence R of light on the rear cover 940 as a horizontal axis and setting the energy of the flash stray light incident on the camera unit 910 as a vertical axis. Note that a value on the vertical axis is a value of the energy of the flash stray light incident on the camera unit 910, which is obtained when energy of incident light on the rear cover 940 is set to 1.

When referring to FIG. 11, it is found that the energy of the flash stray light incident on the camera unit 910 is larger in a case where the angle of incidence R is incident on the rear cover 940 at approximately 80 degrees to 90 degrees. The result shows that, as the flash stray light incident on the camera unit 910, light that is caused by a component in which the angle of incidence R on the rear cover 940 is comparatively large is dominant in the incident light on the rear cover 940. Therefore, it is considered that, in the incident light on the rear cover 940, a component in which the angle of incidence R on the rear cover 940 is comparatively large needs to be reduced in order to reduce an influence of flash stray light on a captured image.

It can be said that light in which the angle of incidence R on the rear cover 940 is comparatively large is light in which an emission angle from the illumination lens 930 is comparatively large. In view of this, the inventors of the present invention analyzed in detail a behavior of light in the illumination lens 930, the light being light in which the emission angle from the illumination lens 930 is comparatively large. Note that the emission angle of the light from the illumination lens 930 described herein means an angle to a thickness direction of the illumination lens 930 (i.e., z-axis direction).

Figure 12:
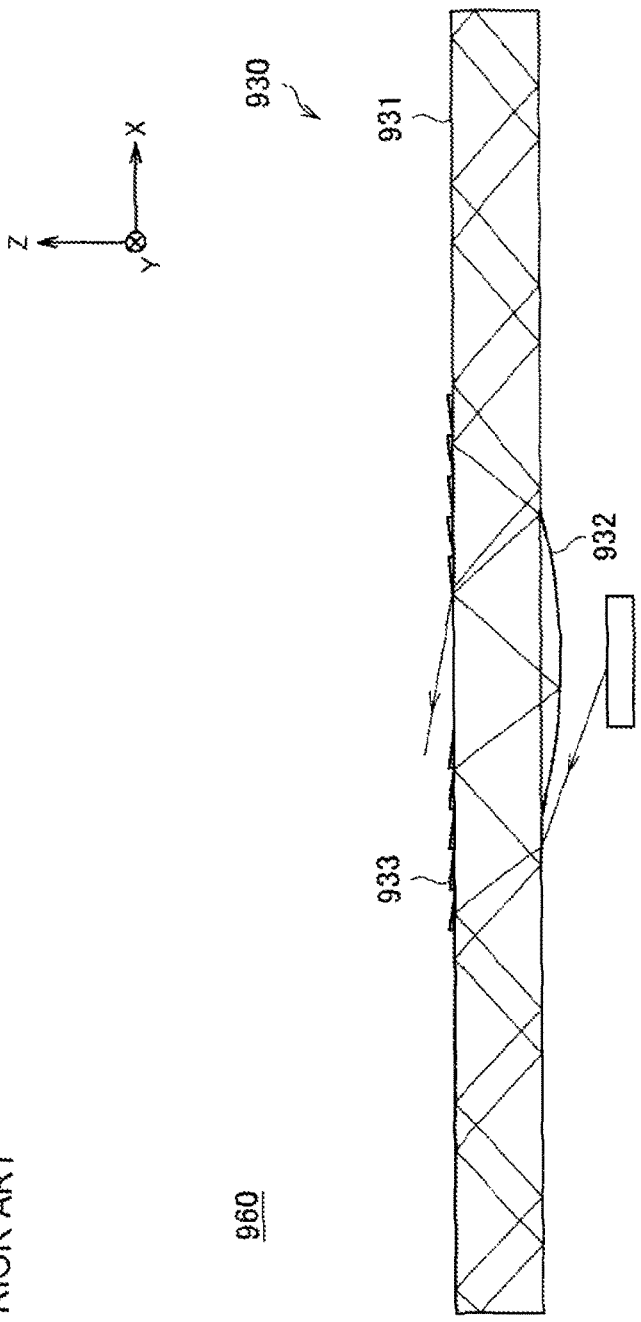
FIG. 12 shows a result of a light beam tracking simulation of light passing through a general illumination lens.

Specifically, the inventors of the present invention prepared a calculation model in which the light source 920 and the illumination lens 930 are simulated and performed a light beam tracking simulation regarding light emitted from the light source 920 and passing through the illumination lens 930. A result thereof is shown in FIG. 12. FIG. 12 shows a result of the light beam tracking simulation of the light passing through the general illumination lens 930.

In order to prevent the drawing from being complicated, only a single light beam in which the emission angle from the illumination lens 930 is comparatively large is extracted from results of the light beam tracking simulation and is shown in FIG. 12. As a result of the light beam tracking simulation, as shown in FIG. 12, it is found that the light in which the emission angle from the illumination lens 930 is comparatively large is light that is guided through the illumination lens 930 while being totally reflected repeatedly on a side end portion and the flat portion 931 of the illumination lens 930.

(1-5. Summary of Study Results)

Hereinabove, the results of study of the existing general image pickup module 90 by the inventors of the present invention have been described. As described above, the inventors of the present invention acquired the following knowledge as a result of study of the general image pickup module 90.

In, for example, the general image pickup module 90 mounted on the electronic apparatus 9 that is a mobile device shown in FIGS. 1 to 3, a part of emitted light from the illumination unit 960 is propagated in the rear cover 940 to be incident on the camera unit 910 in some cases. By performing the experiment in the environment shown in FIG. 4, the inventors of the present invention confirmed that, in the image pickup module 90, light propagated in the rear cover 940 (i.e., flash stray light) may be actually incident on the camera unit 910. The flash stray light is light unintentionally incident on the camera unit 910, and therefore, there is a possibility that the flash stray light has an influence on a captured image acquired by the camera unit 910 and reduces an image quality of the captured image as shown in FIG. 5.

In order to suppress reduction in an image quality of a captured image caused by flash stray light, for example, the image pickup modules 80 and 85 in each of which the flash-stray-light suppression structure is provided, which are shown in FIG. 6 and FIG. 7, are proposed. However, in order to prepare the flash-stray-light suppression structures in those image pickup modules 80 and 85, it is necessary to perform additional processing on the rear cover 940, and therefore an increase in a manufacturing cost is concerned. Thus, there has been required a simpler structure capable of suppressing reduction in an image quality of a captured image caused by flash stray light.

In view of this, the inventors of the present invention performed a more detailed analysis of flash stray light in the general image pickup module 90. As a result, the inventors of the present invention found that the angle of incidence R of light on the rear cover 940 and the energy of flash stray light incident on the camera unit 910 have the relationship shown in FIG. 11. That is, the following knowledge is acquired: as flash stray light incident on the camera unit 910, light that is caused by a component in which the angle of incidence R on the rear cover 940 is comparatively large is dominant in the incident light on the rear cover 940. Based on the result, it is considered that, in the incident light on the rear cover 940, a component in which the angle of incidence R on the rear cover 940 is comparatively large only needs to be reduced in order to reduce an influence of flash stray light on a captured image.

In view of this, the inventors of the present invention further analyzed in detail a behavior of light in the illumination lens 930, the light being light in which the angle of incidence R on the rear cover 940 is comparatively large, i.e., light in which an emission angle thereof is comparatively large in emitted light from the illumination lens 930. As a result of the light beam tracking simulation, it is found that the light in which the emission angle from the illumination lens 930 is comparatively large is light that is guided through the illumination lens 930 while being totally reflected repeatedly on the side end portion and the flat portion 931 of the illumination lens 930 as shown in FIG. 12.

The inventors of the present invention have diligently studied a simpler configuration capable of reducing an influence of flash stray light on a captured image on the basis of the above study results, and, as a result, the inventors of the present invention have arrived at preferred embodiments of the present disclosure. Specifically, in the preferred embodiments of the present disclosure, a reflection suppression structure that suppresses total reflection of light guided through the illumination lens is provided in the side end portion and/or the flat portion of the illumination lens. By providing the reflection suppression structure, total reflection of light guided through the illumination lens can be suppressed on the side end portion and/or flat portion of the illumination lens, and therefore, in emitted light from the illumination lens, a component in which an emission angle thereof is comparatively large can be reduced. In addition, when, in the emitted light from the illumination lens, the component in which the emission angle is comparatively large can be reduced, it is possible to reduce, in incident light on the rear cover 940, a component in which an angle of incidence R thereof is comparatively large, and it is possible to suppress reduction in an image quality of a captured image caused by flash stray light.

Further, the reflection suppression structure is a comparatively simple configuration that can be provided in the flat portion and/or the side end portion of the illumination lens. Therefore, it is possible to suppress reduction in an image quality of a captured image caused by flash stray light without adding a large-scale step or member, unlike the image pickup modules 80 and 85 described above.

Note that, at this time, the reflection suppression structure only needs to be provided in at least a part of a region of the side end portion and/or the flat portion of the illumination lens. This is because the above effect can be obtained when total reflection can be suppressed in any part inside the illumination lens. Further, in order to prevent a function that the illumination lens should originally exhibit from being inhibited by the reflection suppression structure, the reflection suppression structure can be provided in a region in which the reflection suppression structure does not have an influence on a characteristic of the lens portion.

Herein, in, for example, the illumination lens 930 shown in FIG. 9 and FIG. 10, a material or thickness of the lens portion, a characteristic of the lens of the lens portion, and the like are normally designed so that light that has passed through the lens portion has a desired characteristic. In that sense, it can be said that light that is guided through the illumination lens 930 while being totally reflected repeatedly on the side end portion and the flat portion 931, which is shown in FIG. 12, is light departing from the original intention of the design. Such unintentional light is light showing a behavior that is not originally expected, and therefore not only reduction in an image quality of a captured image caused by flash stray light but also deterioration in various characteristics of light emitted via the illumination lens 930 may occur. In fact, it has been confirmed that, as described below with reference to, for example, FIG. 28, a light distribution characteristic or the like of light emitted from the light source 920 and passing through the illumination lens 930 to be emitted deteriorates because of existence of unintentional light and the light distribution characteristic is improved by providing the reflection suppression structure according to the present embodiment. As described above, the reflection suppression structure according to the present embodiment can not only suppress reduction in an image quality of a captured image caused by flash stray light in a case where the illumination lens having the reflection suppression structure is used in the image pickup module but also improve various characteristics of irradiation light via the illumination lens in which the reflection suppression structure is provided.

Further, the above phenomenon in which a characteristic of irradiation light via the illumination lens deteriorates because of unintentional light that is guided while being totally reflected in the illumination lens does not necessarily occur only in an illumination lens for an image pickup module. It can be said that, generally, there is high possibility that, even in an illumination lens for another usage, the above light departing from the original intention of the design causes a characteristic of irradiation light through the illumination lens to deteriorate. In view of this, an illumination lens to which the reflection suppression structure according to the present embodiment is applicable is not necessarily limited to an illumination lens to be mounted on an image pickup module. More generally, by applying the reflection suppression structure according to the present embodiment to an illumination lens that can be mounted on various modules, a characteristic of irradiation light through the illumination lens can be improved.

Hereinafter, some preferred embodiments of the present disclosure, which have been arrived at by the inventors of the present invention, will be described in detail.

2. First Embodiment (2-1. Configuration of Image Pickup Module)

Figure 13:
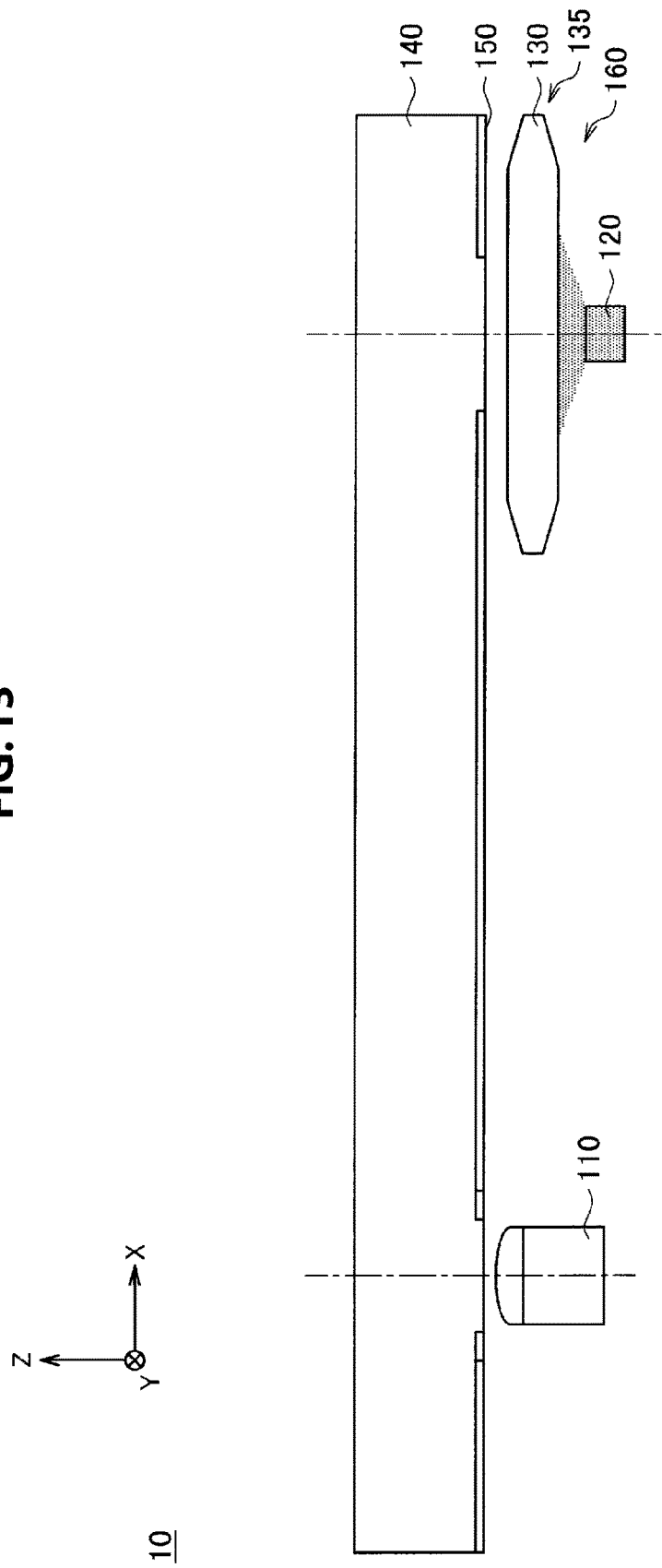
FIG. 13 shows a configuration example of an image pickup module according to a first embodiment.

A configuration of an image pickup module according to a first embodiment will be described with reference to FIG. 13. FIG. 13 shows a configuration example of the image pickup module according to the first embodiment.

When referring to FIG. 13, an image pickup module 10 according to the first embodiment is configured such that a camera unit 110 and an illumination unit 160 are attached to one surface of a rear cover 140 that is a plate-like member. The illumination unit 160 is made up of a light source 120 and an illumination lens 130. Further, on the surface of the rear cover 140 to which the camera unit 110 and the illumination unit 160 are attached, a reflecting film 150 having a characteristic that reflects at least light in a visible light band is provided in a region other than a region in which the camera unit 110 and the illumination unit 160 are attached.

The image pickup module 10, as well as the image pickup module 90 shown in FIG. 1, can be mounted on various electronic apparatuses, in particular, mobile devices such as a smartphone and a tablet PC. Driving of the image pickup module 10 (i.e., camera unit 110 and illumination unit 160) can be controlled as appropriate by a control unit provided in the electronic apparatus. The control unit is configured by, for example, various processors such as a central processing unit (CPU) and a digital signal processor (DSP) or a so-called microcomputer in which the processor and a storage device such as a memory are integrally provided and has a function of controlling operation of the electronic apparatus including the image pickup module 10. The processor executes operation processing based on a predetermined program, and therefore each function of the electronic apparatus is executed.

For example, at the time of capturing an image with a flash, the illumination unit 160 is driven for a predetermined time period in accordance with control from the control unit, and therefore a subject is irradiated with light from the light source 120. Whether or not an image is captured with a flash, i.e., whether or not the illumination unit 160 is driven may be set by a user. Note that control of the image pickup module 10 by the control unit may be similar to drive control of an image pickup module in a general electronic apparatus, and therefore detailed description thereof is herein omitted.

The camera unit 110 is arranged so that an objective lens thereof (i.e., inlet port (not shown) of light) faces the rear cover 140. Further, the illumination unit 160 is arranged on the rear cover 140 so that emitted light from the light source 120 passes through the illumination lens 130 and the rear cover 140 to be emitted toward the outside.

As the light source 120, various light sources that can isotropically emit light, such as an LED, can be used. The specific kind of the light source 120 is not limited, and, as the light source 120, various light sources that can be used as the light source 920 of the general image pickup module 90 are applicable. The illumination lens 130 is made of a transparent material. A specific material of the illumination lens 130 is not limited, and, as the material of the illumination lens 130, for example, various materials that can be used as a material of the illumination lens 930 of the general image pickup module 90, such as various resin materials and glass materials, are applicable.

Herein, configurations and functions of the rear cover 140, the camera unit 110, the light source 120, and the reflecting film 150 may be similar to the configurations and functions of the rear cover 940, the camera unit 910, the light source 920, and the reflecting film 950 of the general image pickup module 90 shown in FIG. 2. In other words, in the first embodiment, as the rear cover 140, the camera unit 110, the light source 120, and the reflecting film 150, members similar to the members used in the general image pickup module 90 may be applied.

In the image pickup module 10 according to the first embodiment, a configuration of the illumination lens 130 is different from the configuration thereof in the general image pickup module 90. Specifically, the illumination lens 130 has, on side end portions thereof, tapered structures 135 whose thickness is gradually reduced toward the side end portions at a predetermined taper angle. The tapered structures 135 are an example of the reflection suppression structure provided in the side end portions. Because the tapered structures 135 are provided, total reflection of light in the illumination lens 130 is suppressed in the tapered structures 135, and therefore it is possible to suppress reduction in an image quality of a captured image caused by flash stray light in the image pickup module 10.

Hereinafter, the structure of the illumination lens 130 will be described in more detail.

(2-2. Configuration of Illumination Lens)

Figure 14:
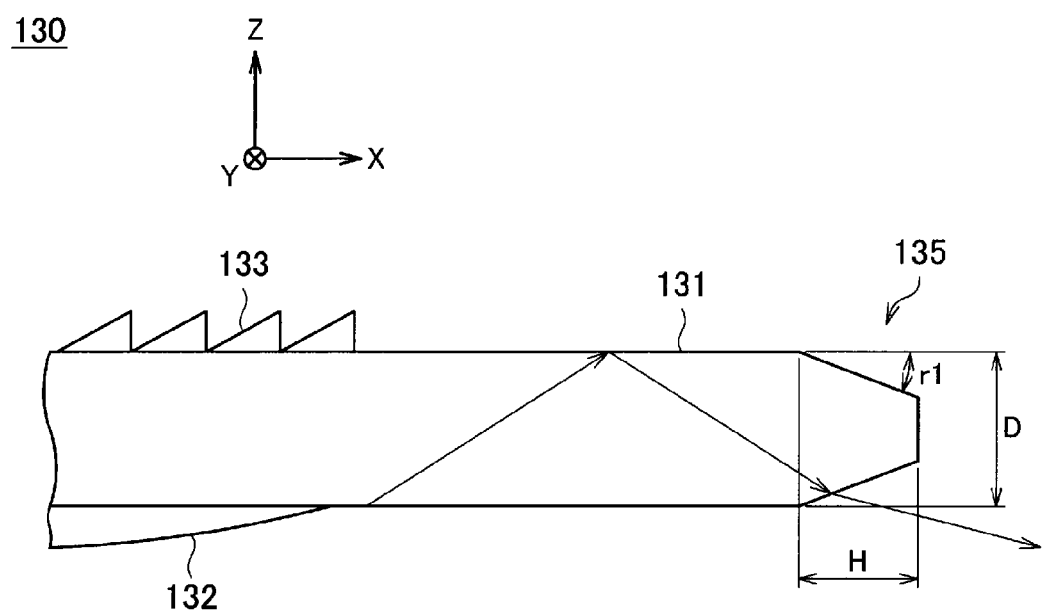
FIG. 14 shows a configuration example of an illumination lens according to the first embodiment.

The configuration of the illumination lens 130 according to the first embodiment will be described with reference to FIG. 14. FIG. 14 shows a configuration example of the illumination lens 130 according to the first embodiment.

Note that the illumination lens 130 according to the first embodiment has a configuration similar to that of the general illumination lens 930 except that the tapered structures 135, which are an example of the reflection suppression structure, are provided in the side end portions thereof. That is, the illumination lens 130 includes a lens portion provided in a substantially central portion on a plate surface of a plate-like member and the tapered structures 135 provided in the side end portions. Further, as the lens portion, for example, a Fresnel lens 133 is provided on an upper surface thereof and a convex lens 132 is provided on a lower surface thereof so that a light distribution characteristic of emitted light from the light source 120 can be converted to a desired characteristic. Therefore, in order to mainly describe the tapered structure 135 that is a characteristic configuration of the illumination lens 130, only a structure in the vicinity of one side end portion of the illumination lens 130 is shown in FIG. 14.

Figure 15:
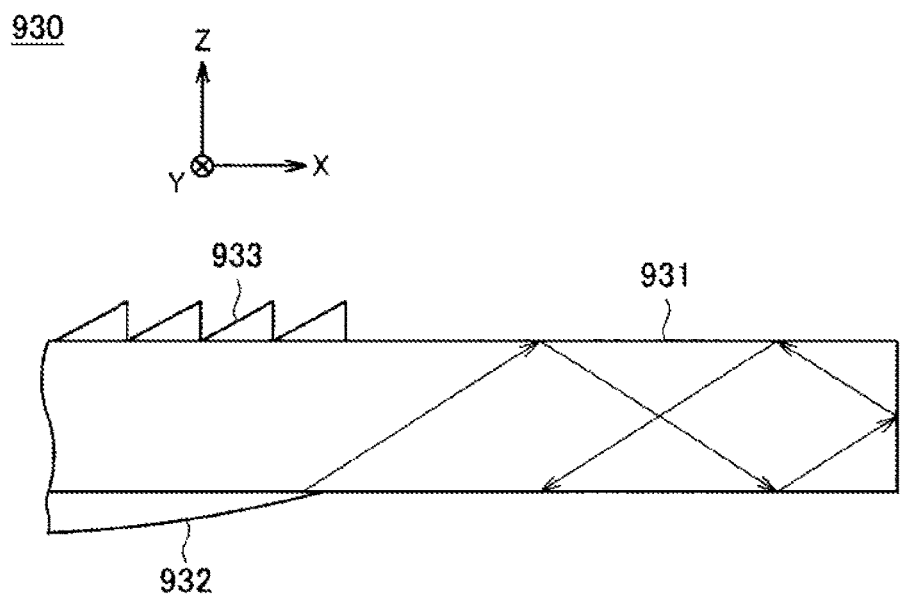
FIG. 15 shows a structure in the vicinity of a side end portion of a general illumination lens.

Further, in FIG. 15, a structure in the vicinity of one side end portion of the general illumination lens 930 is shown for comparison. FIG. 15 shows the structure in the vicinity of the side end portion of the general illumination lens 930. In FIG. 14 and FIG. 15, optical paths in the illumination lenses 130 and 930 are indicated by simulated arrows.

When referring to FIG. 15, total reflection may occur in the side end portion of the general illumination lens 930 as described above with reference to FIG. 12. Meanwhile, as shown in FIG. 14, the tapered structure 135 whose thickness is gradually reduced toward the side end portion at a predetermined taper angle r1 is provided in the side end portion of the illumination lens 130 according to the first embodiment. For example, the tapered structure 135 is provided in the whole region of the side end portion of the illumination lens 130.

By providing the tapered structure 135, as shown in FIG. 14, most of light incident on the side end portion of the illumination lens 130 is transmitted through the tapered structure 135 to be emitted toward the outside of the illumination lens 130, and therefore it is possible to suppress total reflection on the side end portion. As a result, in the image pickup module 10 in which the illumination lens 130 is mounted, it is possible to suppress reduction in an image quality of a captured image caused by flash stray light. Further, the tapered structure 135 can be provided by performing comparatively simple processing on the side end portion of the illumination lens 130. Therefore, the illumination lens 130 according to the first embodiment can suppress reduction in an image quality of a captured image caused by flash stray light with a simpler configuration.

Figure 16:
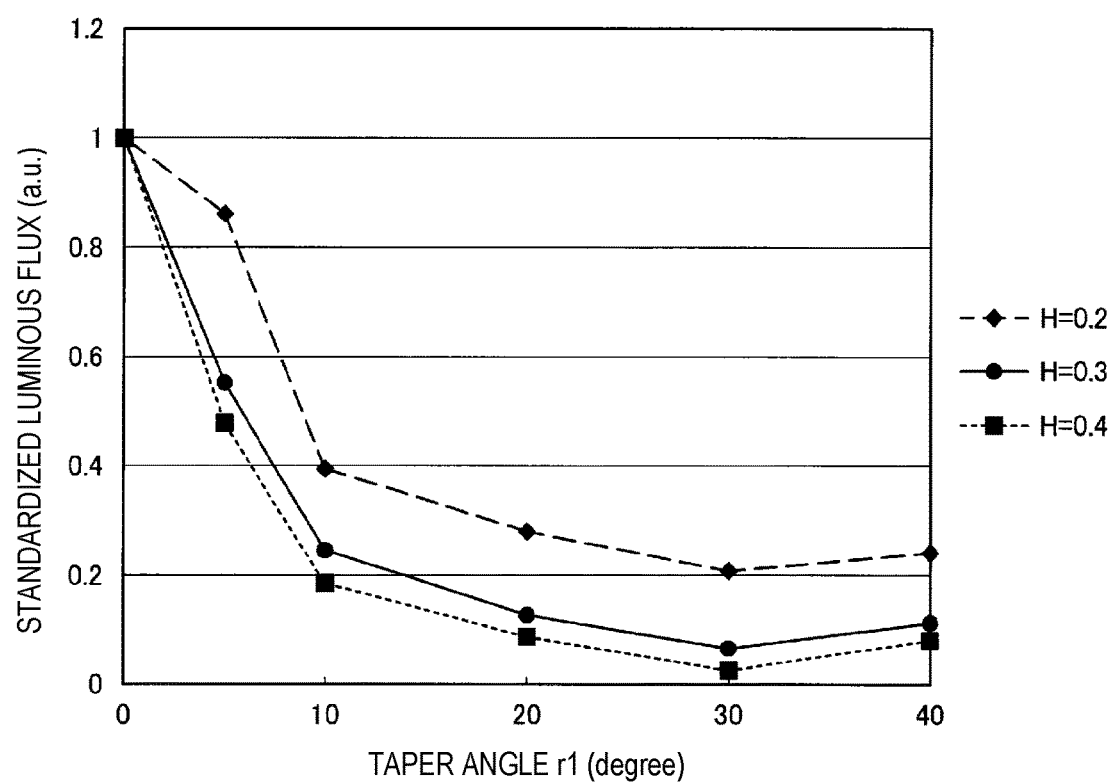
FIG. 16 is a graph showing an amount of flash stray light incident on a camera unit, which is obtained in a case where a tapered structure is provided.

In order to confirm an effect exhibited by the tapered structure 135, the inventors of the present invention examined an amount of flash stray light incident on the camera unit 110 in the image pickup module 10 shown in FIG. 13. A result thereof is shown in FIG. 16. FIG. 16 is a graph showing the amount of the flash stray light incident on the camera unit 110, which is obtained in a case where the tapered structure 135 is provided.

In FIG. 16, by setting the taper angle r1 (see FIG. 14) in the tapered structure 135 as a horizontal axis and setting the amount of the flash stray light incident on the camera unit 110 as a vertical axis, a relationship therebetween is plotted. Further, in FIG. 16, a taper length H in the tapered structure 135 (a length in which the tapered structure 135 is provided in the X-axis direction; see FIG. 14) is changed and the relationship therebetween for each taper length H is shown. Note that, as a value on the vertical axis, a relative value, which is obtained by setting a value obtained in a case where the taper angle r1 is 0 degree, i.e., the tapered structure 135 is not provided to 1, is plotted.

When referring to FIG. 16, it is found that the amount of the flash stray light incident on the camera unit 110 is greatly reduced in a case where the taper angle r1 is approximately 10 degrees or more. It is also found that a reduction amount of the amount of the flash stray light incident on the camera unit 110 is substantially saturated in a case where the taper angle r1 is approximately 30 degrees or more. Note that, even in a case where the taper length H is changed to 0.2 (mm), to 0.3 (mm), and to 0.4 (mm), dependence of the above amount of the flash stray light incident on the camera unit 110 on the taper angle r1 is substantially similar. From the above result, in the tapered structure 135, the taper angle r1 thereof is preferably 10 degrees or more, and the taper angle r1 thereof is more preferably 30 degrees or more.

Note that the experiment result shown in FIG. 16 and experiment results shown in FIG. 18, FIG. 20, FIG. 22, FIG. 24, FIG. 27, and FIG. 28 described below are results obtained when polycarbonate is used as a material of an illumination lens according to each embodiment and a thickness D of a flat portion 131 of the illumination lens is set to 0.7 (mm). However, the experiment results shown in FIG. 16, FIG. 18, FIG. 20, FIG. 22, FIG. 24, FIG. 27, and FIG. 28 are not applied only to a case where polycarbonate is used as the material of the illumination lens, and it is possible to obtain a substantially similar result when the material is a transparent material whose refractive index is approximately 1.4 to 1.7 (for example, various resin materials and glass materials) which is generally used for the illumination lens. Further, as a result of analysis performed by the inventors of the present invention, it has already been confirmed that results substantially similar to the results shown in FIG. 16, FIG. 18, FIG. 20, FIG. 22, FIG. 24, FIG. 27, and FIG. 28 can be obtained even in a case where the thickness D of the flat portion 131 of the illumination lens according to each embodiment is changed.

Hereinabove, the configuration of the illumination lens 130 according to the first embodiment has been described with reference to FIG. 14. Further, an effect that reduces the amount of the flash stray light incident on the camera unit 110, which is exhibited by the illumination lens 130 according to the first embodiment, has been described with reference to FIG. 16. Note that the tapered structure 135 does not need to be provided in the whole region of the side end portion of the illumination lens 130 and may be provided only in a part of the region of the side end portion. Also in this case, the above effect that suppresses total reflection can be obtained in a part in which the tapered structure 135 is provided, and therefore it is possible to reduce the amount of the flash stray light incident on the camera unit 110.

3. Second Embodiment

A second embodiment of the present disclosure will be described. Herein, in each of the first to seventh embodiments of the present disclosure, a reflection suppression structure is provided in an illumination lens of an image pickup module, and, in each embodiment, a configuration of the image pickup module in which the illumination lens is mounted is similar to that of the image pickup module 10 shown in FIG. 13. Therefore, in the following description of the second embodiment to the seventh embodiment, description of the configuration of the image pickup module is omitted and the configuration of the illumination lens will be described in detail.

Further, each of the illumination lenses according to the second embodiment to according to the seventh embodiment described below, as well as the illumination lens 130 according to the first embodiment, has a configuration similar to that of the general illumination lens 930 except that the reflection suppression structure is provided in the side end portion thereof. Therefore, FIG. 17, FIG. 19, FIG. 21, FIG. 23, FIG. 25, and FIG. 26 shown below, as well as FIG. 14, show only structures in the vicinity of the side end portions of the illumination lenses according to the second embodiment to the seventh embodiment. Further, also in each of the drawings, an optical path in the illumination lens according to each embodiment is indicated by a simulated arrow.

Figure 17:
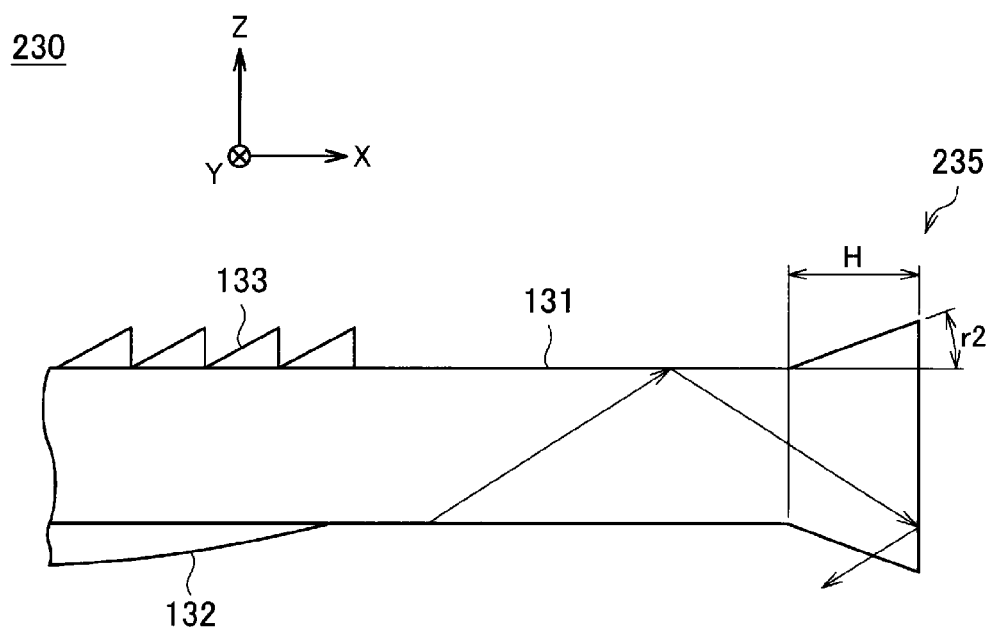
FIG. 17 shows a configuration example of an illumination lens according to a second embodiment.

The configuration of the illumination lens according to the second embodiment will be described with reference to FIG. 17. FIG. 17 shows a configuration example of the illumination lens according to the second embodiment.

When referring to FIG. 17, an illumination lens 230 according to the second embodiment has, on a side end portion thereof, a reverse tapered structure 235 whose thickness is gradually increased toward the side end portion at a predetermined taper angle r2. The reverse tapered structure 235 is an example of the reflection suppression structure provided in the side end portion. For example, the reverse tapered structure 235 is provided in the whole region of the side end portion of the illumination lens 230.

By providing the reverse tapered structure 235, as shown in FIG. 17, most of light incident on the side end portion of the illumination lens 230 is transmitted through the reverse tapered structure 235 to be emitted toward the outside of the illumination lens 230, and therefore it is possible to suppress total reflection on the side end portion. As a result, in the image pickup module in which the illumination lens 230 is mounted, it is possible to suppress reduction in an image quality of a captured image caused by flash stray light. Further, the reverse tapered structure 235 can be provided by performing comparatively simple processing on the side end portion of the illumination lens 230. Therefore, the illumination lens 230 according to the second embodiment can suppress reduction in an image quality of a captured image caused by flash stray light with a simpler configuration.

Figure 18:
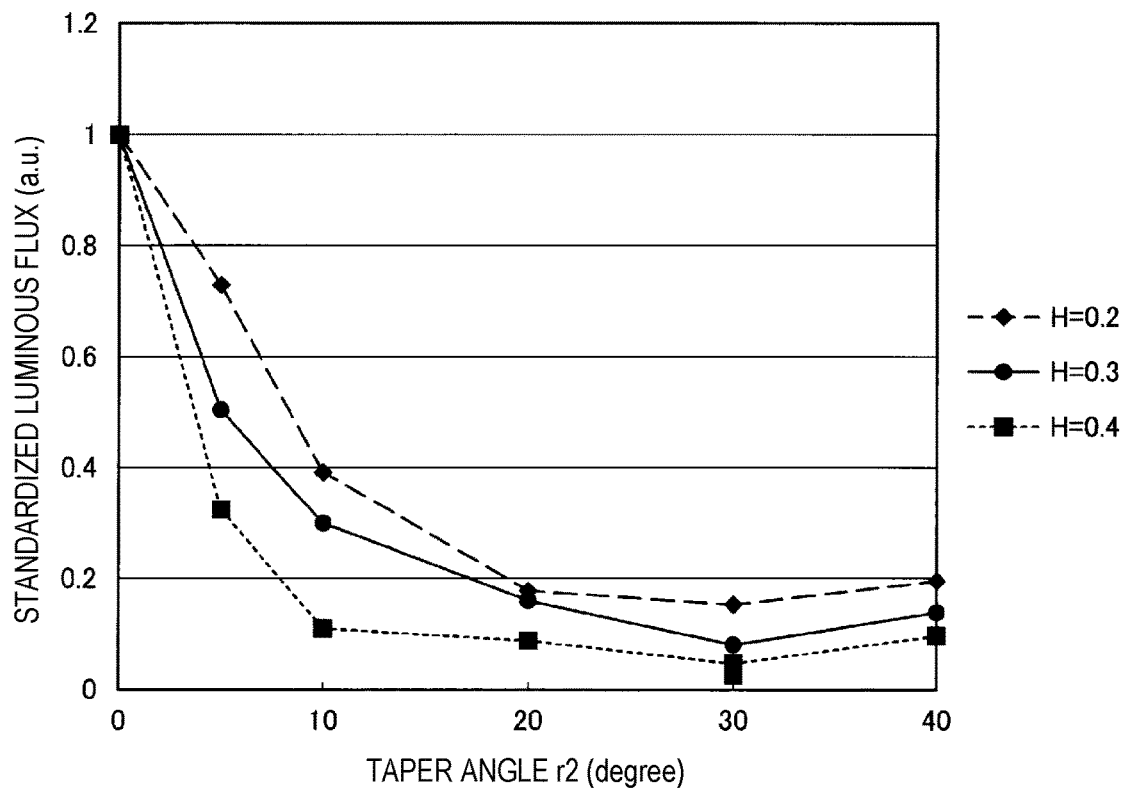
FIG. 18 is a graph showing an amount of flash stray light incident on a camera unit, which is obtained in a case where a reverse tapered structure is provided.

In order to confirm an effect exhibited by the reverse tapered structure 235, the inventors of the present invention examined an amount of flash stray light incident on the camera unit 110, which is obtained in a case where the illumination lens 230 is applied to the image pickup module 10 shown in FIG. 13. A result thereof is shown in FIG. 18. FIG. 18 is a graph showing the amount of the flash stray light incident on the camera unit 110, which is obtained in a case where the reverse tapered structure 235 is provided.

In FIG. 18, by setting the taper angle r2 (see FIG. 17) in the reverse tapered structure 235 as a horizontal axis and setting the amount of the flash stray light incident on the camera unit 110 as a vertical axis, a relationship therebetween is plotted. Further, in FIG. 18, a taper length H in the reverse tapered structure 235 (a length in which the reverse tapered structure 235 is provided in the X-axis direction; see FIG. 17) is changed and the relationship therebetween for each taper length H is shown. Note that, as a value on the vertical axis, a relative value, which is obtained by setting a value obtained in a case where the taper angle r2 is 0 degree, i.e., the reverse tapered structure 235 is not provided to 1, is plotted.

When referring to FIG. 18, it is found that the amount of the flash stray light incident on the camera unit 110 is greatly reduced in a case where the taper angle r2 is approximately 10 degrees or more. It is also found that a reduction amount of the amount of the flash stray light incident on the camera unit 110 is substantially saturated in a case where the taper angle r2 is approximately 30 degrees or more. Note that, even in a case where the taper length H is changed to 0.2 (mm), to 0.3 (mm), and to 0.4 (mm), dependence of the above amount of the flash stray light incident on the camera unit 110 on the taper angle r2 is substantially similar. From the above result, in the reverse tapered structure 235, the taper angle r2 thereof is preferably 10 degrees or more, and the taper angle r2 thereof is more preferably 30 degrees or more.

Hereinabove, the configuration of the illumination lens 230 according to the second embodiment has been described with reference to FIG. 17. Further, an effect that reduces the amount of the flash stray light incident on the camera unit 110, which is exhibited by the illumination lens 230 according to the second embodiment, has been described with reference to FIG. 18. Note that the reverse tapered structure 235 does not need to be provided in the whole region of the side end portion of the illumination lens 230 and may be provided only in a part of the region of the side end portion. Also in this case, the above effect that suppresses total reflection can be obtained in a part in which the reverse tapered structure 235 is provided, and therefore it is possible to reduce the amount of the flash stray light incident on the camera unit 110.

4. Third Embodiment

Figure 19:
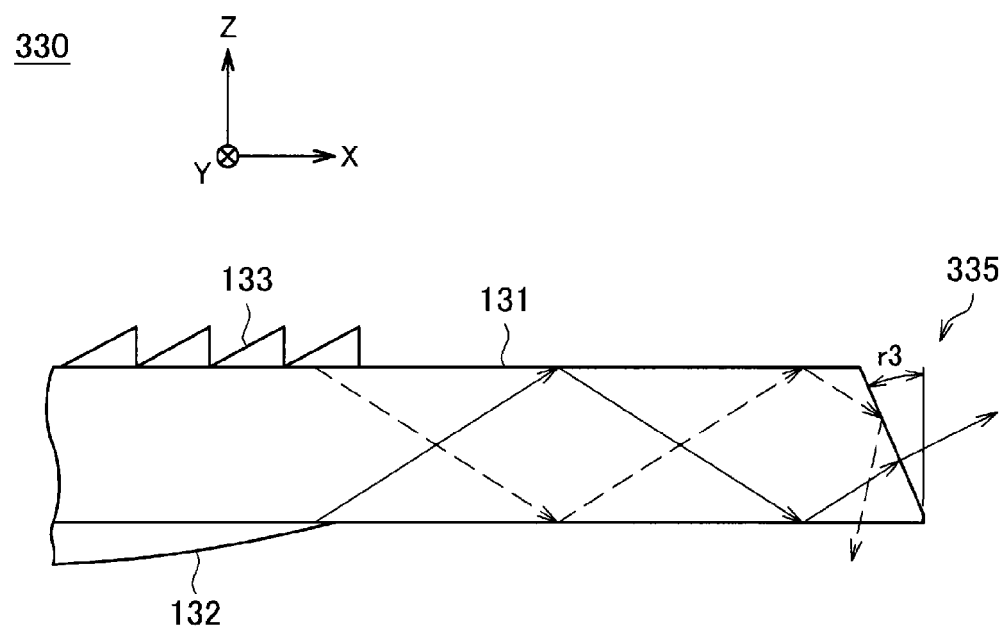
FIG. 19 shows a configuration example of an illumination lens according to a third embodiment.

A configuration of an illumination lens according to a third embodiment will be described with reference to FIG. 19. FIG. 19 shows a configuration example of the illumination lens according to the third embodiment.

When referring to FIG. 19, an illumination lens 330 according to the third embodiment has, on a side end portion thereof, a slope structure 335 in which an end surface of the side end portion is inclined to a thickness direction at a predetermined slope angle r3. The slope structure 335 is an example of the reflection suppression structure provided in the side end portion. For example, the slope structure 335 is provided in the whole region of the side end portion of the illumination lens 330.

By providing the slope structure 335, as shown in FIG. 19, most of light incident on the side end portion of the illumination lens 330 is transmitted through the slope structure 335 to be emitted toward the outside of the illumination lens 330, and therefore it is possible to suppress total reflection on the side end portion. As a result, in the image pickup module in which the illumination lens 330 is mounted, it is possible to suppress reduction in an image quality of a captured image caused by flash stray light. Further, the slope structure 335 can be provided by performing comparatively simple processing on the side end portion of the illumination lens 330. Therefore, the illumination lens 330 according to the third embodiment can suppress reduction in an image quality of a captured image caused by flash stray light with a simpler configuration.

Figure 20:
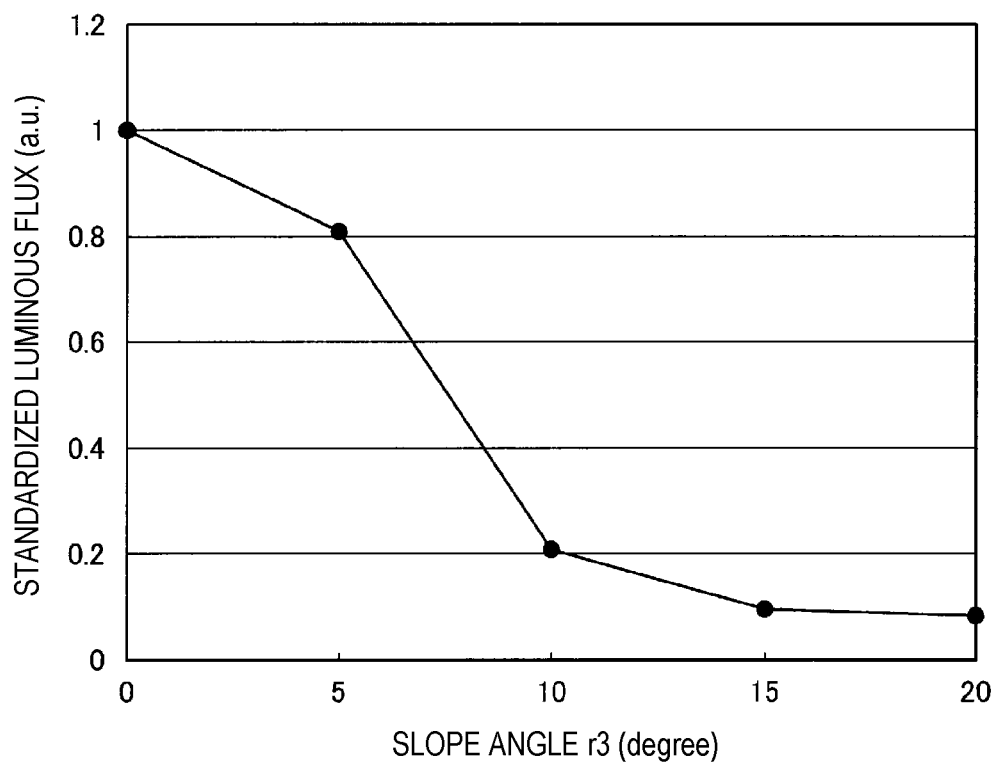
FIG. 20 is a graph showing an amount of flash stray light incident on a camera unit, which is obtained in a case where a slope structure is provided.

In order to confirm an effect exhibited by the slope structure 335, the inventors of the present invention examined an amount of flash stray light incident on the camera unit 110, which is obtained in a case where the illumination lens 330 is applied to the image pickup module 10 shown in FIG. 13. A result thereof is shown in FIG. 20. FIG. 20 is a graph showing the amount of the flash stray light incident on the camera unit 110, which is obtained in a case where the slope structure 335 is provided.

In FIG. 20, by setting the slope angle r3 (slope angle of end surface to thickness direction; see FIG. 19) in the slope structure 335 as a horizontal axis and setting the amount of the flash stray light incident on the camera unit 110 as a vertical axis, a relationship therebetween is plotted. Note that, as a value on the vertical axis, a relative value, which is obtained by setting a value obtained in a case where the slope angle r3 is 0 degree, i.e., the slope structure 335 is not provided to 1, is plotted.

When referring to FIG. 20, it is found that the amount of flash stray light incident on the camera unit 110 is greatly reduced in a case where the slope angle r3 is approximately 10 degrees or more. From the result, in the slope structure 335, the slope angle r3 thereof is preferably 10 degrees or more.

Hereinabove, the configuration of the illumination lens 330 according to the third embodiment has been described with reference to FIG. 19. Further, an effect that reduces the amount of the flash stray light incident on the camera unit 110, which is exhibited by the illumination lens 330 according to the third embodiment, has been described with reference to FIG. 20. Note that the slope structure 335 does not need to be provided in the whole region of the side end portion of the illumination lens 230 and may be provided only in a part of the region of the side end portion. Also in this case, the above effect that suppresses total reflection can be obtained in a part in which the slope structure 335 is provided, and therefore it is possible to reduce the amount of the flash stray light incident on the camera unit 110.

5. Fourth Embodiment

Figure 21:
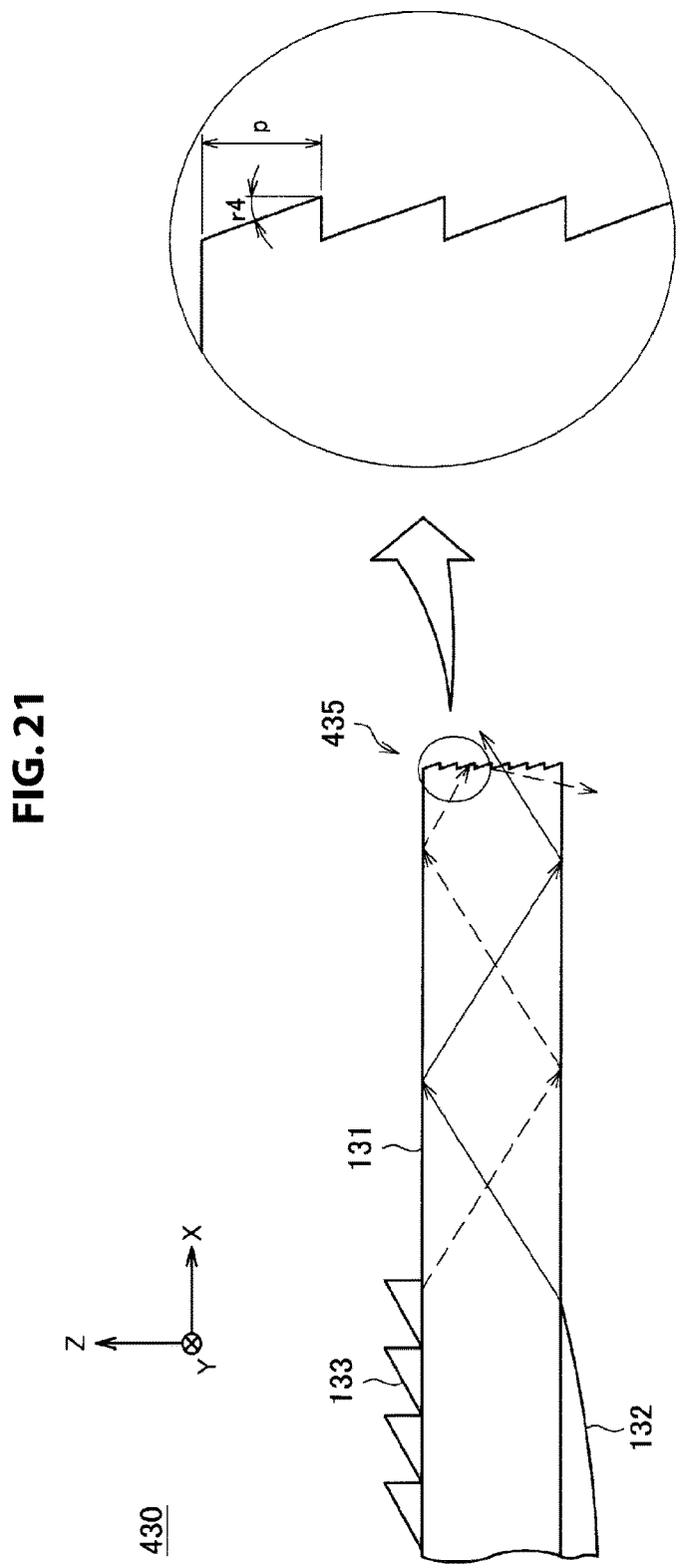
FIG. 21 shows a configuration example of an illumination lens according to a fourth embodiment.

A configuration of an illumination lens according to a fourth embodiment will be described with reference to FIG. 21. FIG. 21 shows a configuration example of the illumination lens according to the fourth embodiment.

When referring to FIG. 21, an illumination lens 430 according to the fourth embodiment has, on a side end portion thereof, a prism structure 435 in which an uneven structure is provided with a predetermined pitch in a thickness direction. The prism structure 435 is an example of the reflection suppression structure provided in the side end portion. The prism structure 435 is provided by arranging uneven structures (step structures) inclined to the thickness direction at a predetermined angle (prism angle r4) with a predetermined pitch p. For example, the prism structure 435 is provided in the whole region of the side end portion of the illumination lens 430.

By providing the prism structure 435, as shown in FIG. 21, most of light incident on the side end portion of the illumination lens 430 is transmitted through the prism structure 435 to be emitted toward the outside of the illumination lens 430, and therefore it is possible to suppress total reflection on the side end portion. As a result, in the image pickup module in which the illumination lens 430 is mounted, it is possible to suppress reduction in an image quality of a captured image caused by flash stray light. Further, the prism structure 435 can be provided by performing comparatively simple processing on the side end portion of the illumination lens 430. Therefore, the illumination lens 430 according to the fourth embodiment can suppress reduction in an image quality of a captured image caused by flash stray light with a simpler configuration.

Figure 22:
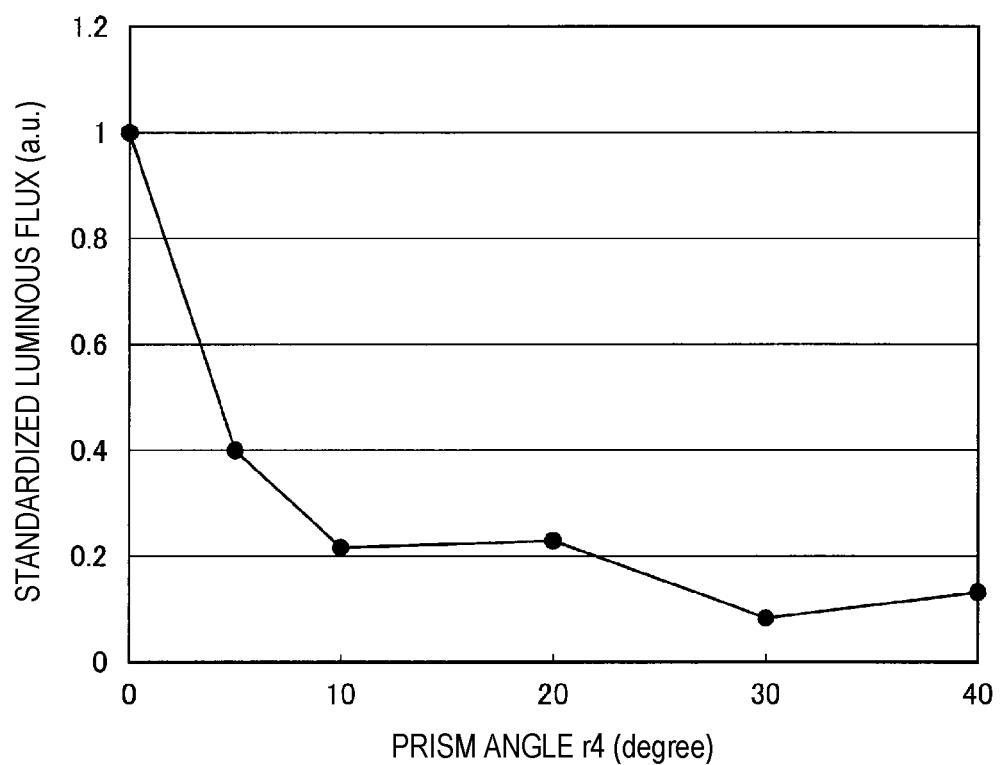
FIG. 22 is a graph showing an amount of flash stray light incident on a camera unit, which is obtained in a case where a prism structure is provided.

In order to confirm an effect exhibited by the prism structure 435, the inventors of the present invention examined an amount of flash stray light incident on the camera unit 110, which is obtained in a case where the illumination lens 430 is applied to the image pickup module 10 shown in FIG. 13. A result thereof is shown in FIG. 22. FIG. 22 is a graph showing the amount of the flash stray light incident on the camera unit 110, which is obtained in a case where the prism structure 435 is provided.

In FIG. 22, by setting the prism angle r4 (see FIG. 21) in the prism structure 435 as a horizontal axis and setting the amount of the flash stray light incident on the camera unit 110 as a vertical axis, a relationship therebetween is plotted. Note that, as a value on the vertical axis, a relative value, which is obtained by setting a value obtained in a case where the prism angle r4 is 0 degree, i.e., the prism structure 435 is not provided to 1, is plotted. Further, FIG. 22 shows a result obtained in a case where the pitch p of the uneven structure in the prism structure 435 is 0.07 (mm) as an example.

When referring to FIG. 22, it is found that the amount of the flash stray light incident on the camera unit 110 is greatly reduced in a case where the prism angle r4 is approximately 10 degrees or more. It is also found that a reduction amount of the amount of the flash stray light incident on the camera unit 110 is substantially saturated in a case where the prism angle r4 is approximately 30 degrees or more. From the above result, in the prism structure 435, the prism angle r4 thereof is preferably 10 degrees or more, and the prism angle r4 thereof is more preferably 30 degrees or more.

Hereinabove, the configuration of the illumination lens 430 according to the fourth embodiment has been described with reference to FIG. 21. Further, an effect that reduces the amount of the flash stray light incident on the camera unit 110, which is exhibited by the illumination lens 430 according to the fourth embodiment, has been described with reference to FIG. 22. Note that the prism structure 435 does not need to be provided in the whole region of the side end portion of the illumination lens 430 and may be provided only in a part of the region of the side end portion. Also in this case, the above effect that suppresses total reflection can be obtained in a part in which the prism structure 435 is provided, and therefore it is possible to reduce the amount of the flash stray light incident on the camera unit 110.

6. Fifth Embodiment

A fifth embodiment of the present disclosure will be described. Herein, as the reflection suppression structure, shapes of the side end portions of the illumination lenses 130, 230, 330, and 430 are changed from a general shape in all the first embodiment to the fourth embodiment described above. However, the shape of the side end portion that can function as the reflection suppression structure is not limited to the shapes shown in the first embodiment to the fourth embodiment and may have another shape. In the fifth embodiment, such illumination lenses having a shape of a side end portion that can function as the reflection suppression structure, which are different from the first embodiment to the fourth embodiment, will be described.

Figure 23:
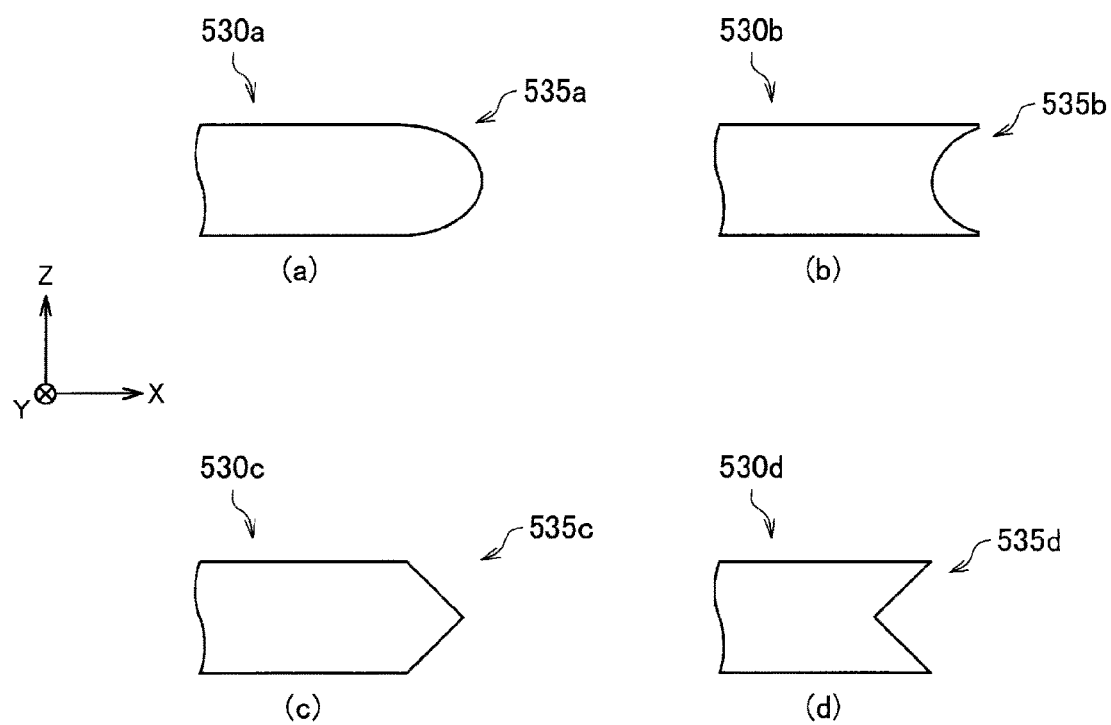
FIG. 23 shows configuration examples of an illumination lens according to a fifth embodiment.

A configuration of the illumination lens according to the fifth embodiment will be described with reference to FIG. 23. FIG. 23 shows configuration examples of the illumination lens according to the fifth embodiment.

As the illumination lens according to the fifth embodiment, FIG. 23 shows four kinds of illumination lenses 530a, 530b, 530c, and 530d whose reflection suppression structures have different shapes. When referring to FIG. 23(a), the illumination lens 530a has, on a side end portion thereof, a protruding structure 535a (hereinafter, also referred to as "protruding cylindrical structure 535a") which protrudes toward the side to have an arc shape. When referring to FIG. 23(b), the illumination lens 530b has, on a side end portion thereof, a recessed structure 535b (hereinafter, also referred to as "recessed cylindrical structure 535b") which is recessed to the side to have an arc shape.

When referring to FIG. 23(c), the illumination lens 530c has, on a side end portion thereof, a protruding structure 535c (hereinafter, also referred to as "protruding triangular prism structure 535c") which protrudes toward the side to have a wedge shape. When referring to FIG. 23(d), the illumination lens 530d has, on a side end portion thereof, a recessed structure 535d (hereinafter, also referred to as "recessed triangular prism structure 535d") which is recessed to the side to have a wedge shape. All the protruding cylindrical structure 535a, the recessed cylindrical structure 535b, the protruding triangular prism structure 535c, and the recessed triangular prism structure 535d are examples of the reflection suppression structure provided in the side end portion. For example, the protruding cylindrical structure 535a, the recessed cylindrical structure 535b, the protruding triangular prism structure 535c, and the recessed triangular prism structure 535d are provided in the whole regions of the side end portions of the illumination lenses 530a, 530b, 530c, and 530d, respectively.

By providing the protruding cylindrical structure 535a, the recessed cylindrical structure 535b, the protruding triangular prism structure 535c, or the recessed triangular prism structure 535d, most of light incident on the side end portion of the illumination lens 530a, 530b, 530c, or 530d is transmitted through the protruding cylindrical structure 535a, the recessed cylindrical structure 535b, the protruding triangular prism structure 535c, or the recessed triangular prism structure 535d to be emitted toward the outside of the illumination lens 530a, 530b, 530c, or 530d. Therefore, it is possible to suppress total reflection on the side end portion. As a result, in the image pickup module in which the illumination lens 530a, 530b, 530c, or 530d is mounted, it is possible to suppress reduction in an image quality of a captured image caused by flash stray light. Further, the protruding cylindrical structure 535a, the recessed cylindrical structure 535b, the protruding triangular prism structure 535c, and the recessed triangular prism structure 535d can be provided by performing comparatively simple processing on the side end portions of the illumination lenses 530a, 530b, 530c, and 530d, respectively. Therefore, the illumination lenses 530a, 530b, 530c, and 530d according to the fifth embodiment can suppress reduction in an image quality of a captured image caused by flash stray light with a simpler configuration.

Figure 24:
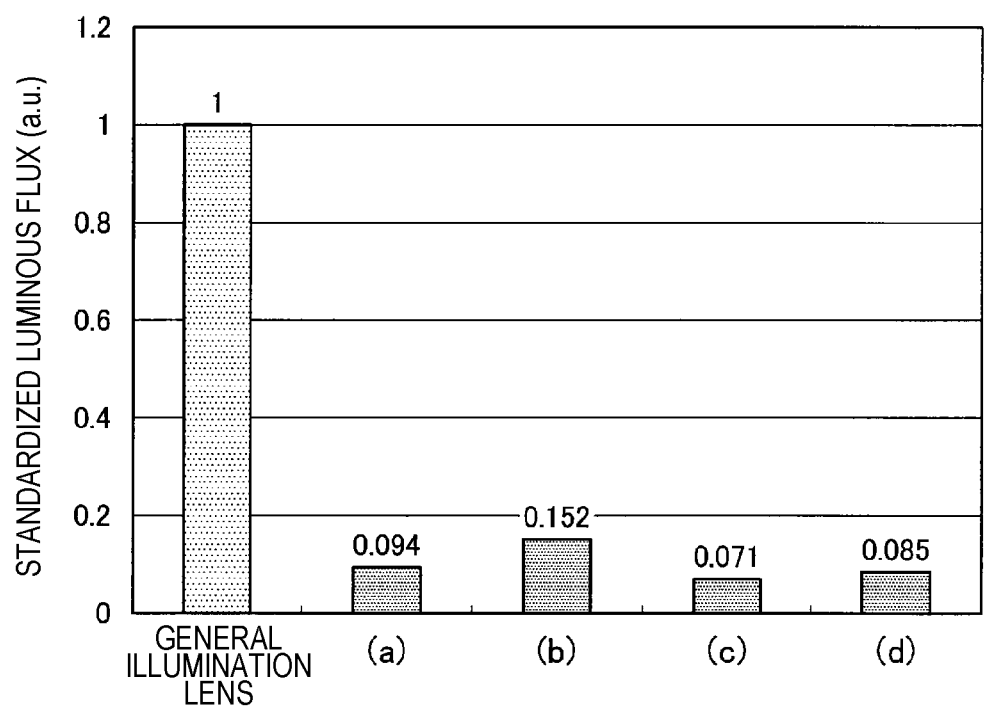
FIG. 24 is a graph showing an amount of flash stray light incident on a camera unit, which is obtained in a case where a protruding cylindrical structure, a recessed cylindrical structure, a recessed triangular prism structure, or a recessed triangular prism structure is provided.

In order to confirm an effect exhibited by the protruding cylindrical structure 535a, the recessed cylindrical structure 535b, the protruding triangular prism structure 535c, or the recessed triangular prism structure 535d, the inventors of the present invention examined an amount of flash stray light incident on the camera unit 110, which is obtained in a case where the illumination lens 530a, 530b, 530c, or 530d is applied to the image pickup module 10 shown in FIG. 13. Results thereof are shown in FIG. 24. FIG. 24 is a graph showing the amount of the flash stray light incident on the camera unit 110, which is obtained in a case where the protruding cylindrical structure 535a, the recessed cylindrical structure 535b, the protruding triangular prism structure 535c, or the recessed triangular prism structure 535d is provided.

In FIG. 24, the amount of the flash stray light incident on the camera unit 110 is set as a vertical axis, and the amounts of the flash stray light incident on the camera unit 110 are plotted for the general illumination lens 930 in which the reflection suppression structure is not provided, the illumination lens 530a in which the protruding cylindrical structure 535a is provided, the illumination lens 530b in which the recessed cylindrical structure 535b is provided, the illumination lens 530c in which the protruding triangular prism structure 535c is provided, and the illumination lens 530d in which the recessed triangular prism structure 535d is provided. Note that, as a value on the vertical axis, a relative value obtained in a case where a value of the general illumination lens 930 is set to 1 is plotted.

(a), (b), (c), and (d) in FIG. 24 correspond to (a), (b), (c), and (d) in FIG. 23. That is, (a) shows a result regarding the illumination lens 530a in which the protruding cylindrical structure 535a is provided, (b) shows a result regarding the illumination lens 530b in which the recessed cylindrical structure 535b is provided, (c) shows a result of the illumination lens 530c in which the protruding triangular prism structure 535c is provided, and (d) shows a result of the illumination lens 530d in which the recessed triangular prism structure 535d is provided.

When referring to FIG. 24, it is found that the amount of the flash stray light incident on the camera unit 110 is greatly reduced in a case where any of the protruding cylindrical structure 535a, the recessed cylindrical structure 535b, the protruding triangular prism structure 535c, and the recessed triangular prism structure 535d is provided as the reflection suppression structure, as compared to a case where the reflection suppression structure is not provided.

Herein, all the protruding cylindrical structure 535a, the recessed cylindrical structure 535b, the protruding triangular prism structure 535c, and the recessed triangular prism structure 535d are structures in which side surfaces of the illumination lenses 530a, 530b, 530c, and 530d are not vertical to the plate surfaces. The results shown in FIG. 24 show that, because the protruding structure or recessed structure in which the side surface is not vertical to the plate surface is provided in the side end portion, it is possible to suppress total reflection of light in the illumination lenses 530a, 530b, 530c, and 530d, and thus it is possible to reduce the amount of the flash stray light incident on the camera unit 110. The results shown in FIG. 24 also show that specific shapes of the protruding structure and the recessed structure to exhibit an effect that reduces the amount of the flash stray light incident on the camera unit 110 are not limited to unique shapes and can be arbitrarily set.

Hereinabove, the configurations of the illumination lenses 530a, 530b, 530c, and 530d according to the fifth embodiment have been described with reference to FIG. 23. Further, the effect that reduces the amount of flash stray light incident on the camera unit 110, which is exhibited by the illumination lenses 530a, 530b, 530c, and 530d according to the fifth embodiment, has been described with reference to FIG. 24. Note that the protruding cylindrical structure 535a, the recessed cylindrical structure 535b, the protruding triangular prism structure 535c, and the recessed triangular prism structure 535d do not need to be provided in the whole regions of the side end portions of the illumination lenses 530a, 530b, 530c, and 530d, respectively, and may be provided in a part of the regions of the side end portions. Also in this case, the above effect that suppresses total reflection can be obtained in a part in which the protruding cylindrical structure 535a, the recessed cylindrical structure 535b, the protruding triangular prism structure 535c, or the recessed triangular prism structure 535d is provided, and therefore it is possible to reduce the amount of the flash stray light incident on the camera unit 110.

7. Sixth Embodiment

Figure 25:
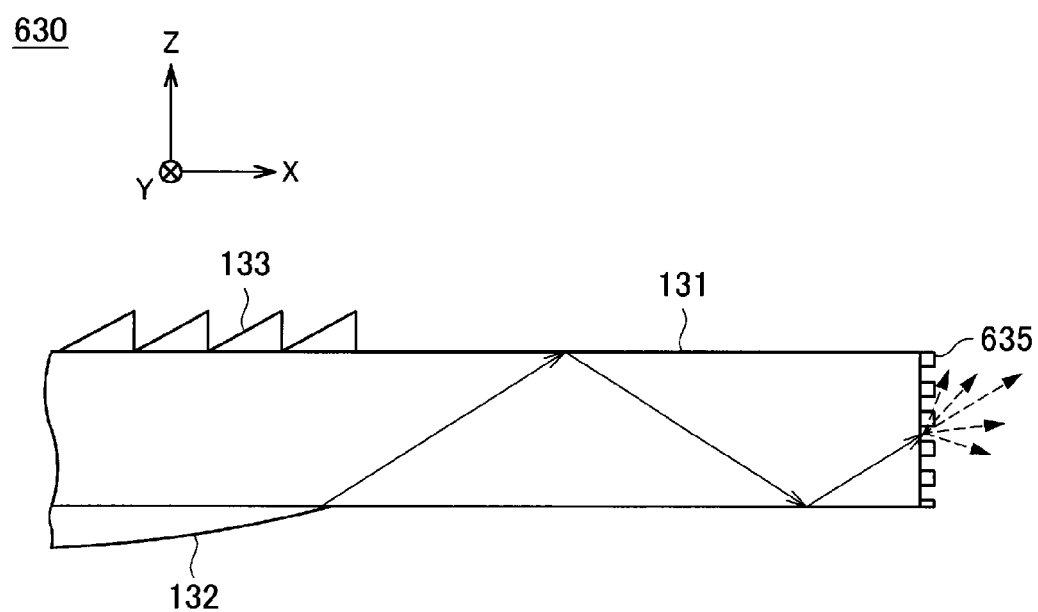
FIG. 25 shows a configuration example of an illumination lens according to a sixth embodiment.

A configuration of an illumination lens according to a sixth embodiment will be described with reference to FIG. 25. FIG. 25 shows a configuration example of the illumination lens according to the sixth embodiment.

When referring to FIG. 25, an illumination lens 630 according to the sixth embodiment has, on a side end portion thereof, a scattering structure 635 for scattering light from the inside and emitting the light toward the outside. The scattering structure 635 is an example of the reflection suppression structure provided in the side end portion. For example, the scattering structure 635 is provided in the whole region of the side end portion of the illumination lens 630.

The scattering structure 635 is realized by, for example, providing minute unevenness on a side surface of the illumination lens 630 or thinly applying white ink to the side surface of the illumination lens 630. However, a specific structure of the scattering structure 635 is not limited to such an example and the scattering structure 635 may be realized by another structure.

By providing the scattering structure 635, as shown in FIG. 25, most of light incident on the side surface of the illumination lens 630 is scattered on the scattering structure 635 to be emitted toward the outside of the illumination lens 630, and therefore it is possible to suppress total reflection on the side end portion. As a result, in the image pickup module in which the illumination lens 630 is mounted, it is possible to suppress reduction in an image quality of a captured image caused by flash stray light. Further, the scattering structure 635 can be provided by performing comparatively simple processing on the side end portion of the illumination lens 630. Therefore, the illumination lens 630 according to the sixth embodiment can suppress reduction in an image quality of a captured image caused by flash stray light with a simpler configuration.

Hereinabove, the configuration of the illumination lens 630 according to the sixth embodiment has been described with reference to FIG. 25. Note that the scattering structure 635 does not need to be provided in the whole region of the side end portion of the illumination lens 630 and may be provided only in a part of the region of the side end portion. Also in this case, the above effect that suppresses total reflection can be obtained in a part in which the scattering structure 635 is provided, and therefore it is possible to reduce the amount of the flash stray light incident on the camera unit 110.

8. Seventh Embodiment

A seventh embodiment of the present disclosure will be described. Herein, in all the first embodiment to the sixth embodiment described above, the reflection suppression structures suppress total reflection by transmitting light from the inside of the illumination lenses 130, 230, 330, 430, 530a, 530b, 530c, 530d, and 630 toward the outside thereof and emitting the light toward the outside. However, a reflection suppression structure is not limited to such a structure that transmits light and may be, for example, a structure that suppresses total reflection by absorbing light. In the seventh embodiment, a configuration example of such a reflection suppression structure that suppresses total reflection by using a function different from the functions in the first embodiment to the sixth embodiment will be described.

Figure 26:
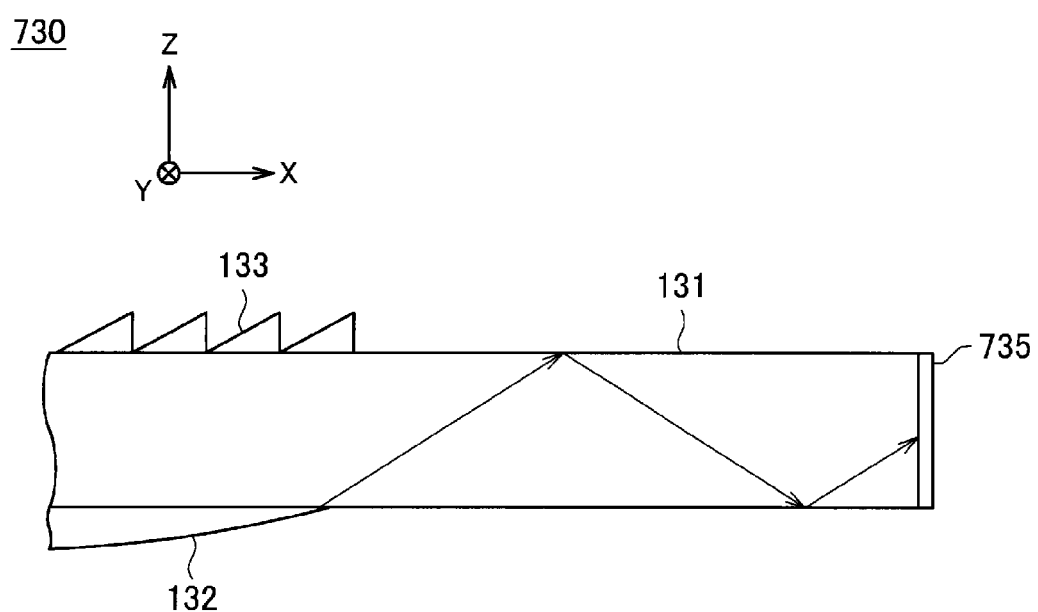
FIG. 26 shows a configuration example of an illumination lens according to a seventh embodiment.

A configuration of an illumination lens according to the seventh embodiment will be described with reference to FIG. 26. FIG. 26 shows a configuration example of the illumination lens according to the seventh embodiment.

When referring to FIG. 26, an illumination lens 730 according to the seventh embodiment has, on a side end portion thereof, an absorption member 735 for absorbing incident light. The absorption member 735 is an example of the reflection suppression structure provided in the side end portion. For example, the absorption member 735 is provided in the whole region of the side end portion of the illumination lens 730.

The absorption member 735 is, for example, a light-absorbing resist applied to a side surface of the illumination lens 730. However, a specific configuration of the absorption member 735 is not limited to such an example, and the absorption member 735 may be, for example, a light shielding tape, a member to which one or more layers of a material used for a color filter are applied, or a neutral density (ND) filter.

By providing the absorption member 735, as shown in FIG. 26, most of light incident on the side surface of the illumination lens 730 is absorbed by the absorption member 735, and therefore it is possible to suppress total reflection on the side end portion. As a result, in the image pickup module in which the illumination lens 730 is mounted, it is possible to suppress reduction in an image quality of a captured image caused by flash stray light. Further, the absorption member 735 can be provided by performing comparatively simple processing on the side end portion of the illumination lens 730. Therefore, the illumination lens 730 according to the seventh embodiment can suppress reduction in an image quality of a captured image caused by flash stray light with a simpler configuration.

Figure 27:
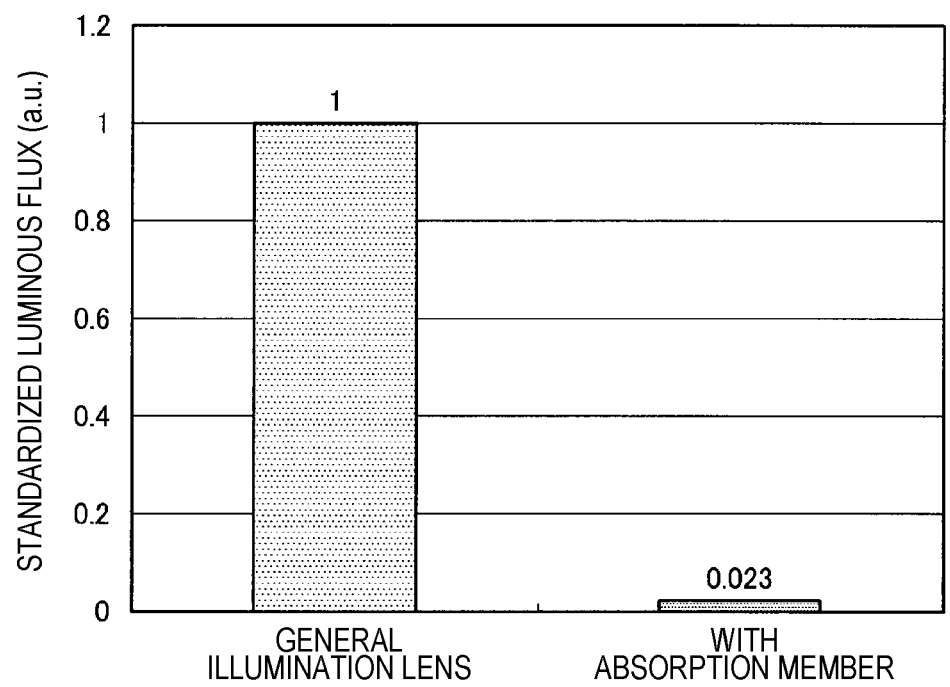
FIG. 27 is a graph showing an amount of flash stray light incident on a camera unit, which is obtained in a case where an absorption member is provided.

In order to confirm an effect exhibited by the absorption member 735, the inventors of the present invention examined an amount of flash stray light incident on the camera unit 110, which is obtained in a case where the illumination lens 730 is applied to the image pickup module 10 shown in FIG. 13. A result thereof is shown in FIG. 27. FIG. 27 is a graph showing the amount of the flash stray light incident on the camera unit 110, which is obtained in a case where the absorption member 735 is provided.

In FIG. 27, the amount of the flash stray light incident on the camera unit 110 is set as a vertical axis, and the amounts of the flash stray light incident on the camera unit 110 are plotted for the general illumination lens 930 in which the reflection suppression structure is not provided and the illumination lens 730 in which the absorption member 735 is provided. Note that, as a value on the vertical axis, a relative value obtained in a case where a value of the general illumination lens 930 is set to 1 is plotted.

When referring to FIG. 27, it is found that the amount of the flash stray light incident on the camera unit 110 is greatly reduced by providing the absorption member 735 as the reflection suppression structure, as compared to a case where the reflection suppression structure is not provided.

Figure 28:
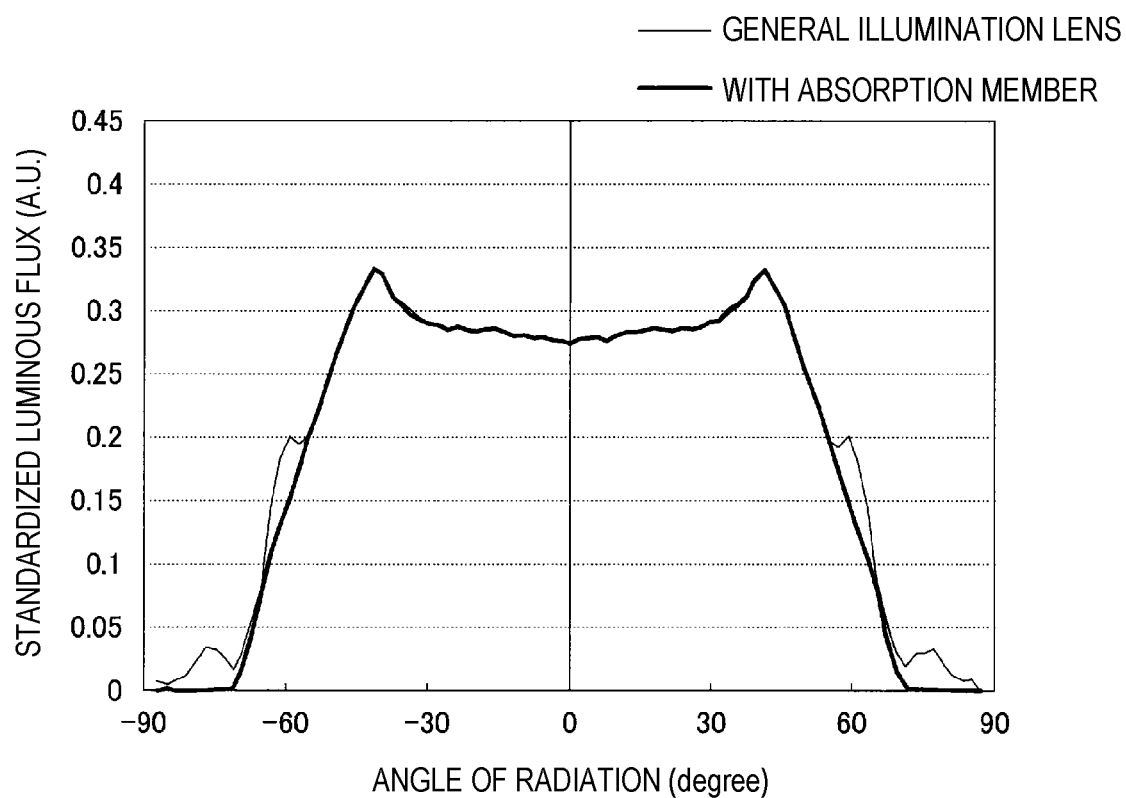
FIG. 28 is a graph showing a light distribution characteristic of an illumination lens in which an absorption member is provided.

Herein, the inventors of the present invention further examined a light distribution characteristic of the illumination lens 730 in which the absorption member 735 is provided. A result thereof is shown in FIG. 28. FIG. 28 is a graph showing the light distribution characteristic of the illumination lens 730 in which the absorption member 735 is provided.

In FIG. 28, by setting an angle of radiation of irradiation light obtained in a case where emitted light from a predetermined light source is emitted via the illumination lens 730 as a horizontal axis and setting standardized luminance of the irradiation light as a vertical axis, a relationship therebetween is plotted. Further, in FIG. 28, standardized luminance obtained in a case of using the general illumination lens 930 in which the reflection suppression structure is not provided is also plotted for comparison.

When referring to FIG. 28, it is found that, in the illumination lens 730 in which the absorption member 735 is provided, the light distribution characteristic is modest, as compared to the general illumination lens 930, and unevenness of irradiation light is more reduced. The result shows that a subject can be irradiated with more natural flash light by using the illumination lens 730.

Note that, although FIG. 28 shows the light distribution characteristic obtained in a case where the illumination lens 730 according to the seventh embodiment is used as an example, it is considered that, even in a case where the illumination lenses 130 to 630 according to the first embodiment to the sixth embodiment are used, a similar effect that improves the light distribution characteristic can be obtained. This is because it is considered that one of factors that cause the light distribution characteristic of the general illumination lens 930 to deteriorate is light departing from the original intention of the design, the light being guided through the illumination lens 930 while being totally reflected repeatedly on the side end portion and the flat portion 931 of the illumination lens 930, and therefore it is considered that the effect that that can improve the light distribution characteristic, which is similar to the effect shown in FIG. 28, can be obtained even in a case where any illumination lens is used as long as the illumination lens has a reflection suppression structure, such as the illumination lenses 130 to 730.

Hereinabove, the configuration of the illumination lens 730 according to the seventh embodiment has been described with reference to FIG. 26. Further, the effect that reduces the amount of the flash stray light incident on the camera unit 110 by using the illumination lens 730 according to the seventh embodiment and the light distribution characteristic thereof have been described with reference to FIG. 27 and FIG. 28. Note that the absorption member 735 does not need to be provided in the whole region of the side end portion of the illumination lens 730 and may be provided only in a part of the region of the side end portion. Also in this case, the above effect that suppresses total reflection can be obtained in a part in which the absorption member 735 is provided, and therefore it is possible to reduce the amount of the flash stray light incident on the camera unit 110.

9. Supplement

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

For example, although a case where the reflection suppression structure is provided in the side end portion has been described in the first embodiment to the seventh embodiment described above, the present disclosure is not limited to such examples. For example, the reflection suppression structure may be provided in the flat portion 131 of each of the illumination lenses 130 to 730. According to the present disclosure, in a case where total reflection on the flat portion 131 or the side end portion of each of the illumination lenses 130 to 730 can be suppressed, it is possible to obtain an effect similar to the effect described above. Further, the reflection suppression structure does not need to be provided in the whole region of the flat portion 131 and/or the whole region of the side end portion and may be provided only in a part of the region of the flat portion 131 and/or a part of the region of the side end portion.

Further, a specific configuration of the reflection suppression structure is not limited to the examples shown in the first embodiment to the seventh embodiment described above. The reflection suppression structure only needs to have a structure that suppresses total reflection of light inside each of the illumination lenses 130 to 730, and a specific structure thereof may be various arbitrary structures.

Further, although, in the first embodiment to the seventh embodiment described above, the illumination lenses 130 to 730 are used as a lens for capturing an image with a flash in the image pickup module 10, the present disclosure is not limited to such examples. As described in the above section (1-5. Summary of study results), in the general illumination lens 930, light that is guided through the illumination lens 930 while being totally reflected repeatedly on the side end portion and the flat portion 931 of the illumination lens 930 is light departing from the original intention of the design, and there is a fear that such light causes an optical characteristic of irradiation light from the illumination lens 930 to deteriorate. Such a phenomenon does not necessarily occur only in an illumination lens for an image pickup module, and it can be said that there is a high possibility that, even in an illumination lens for another usage, light departing from the original intention of the design causes a characteristic of irradiation light from the illumination lens to deteriorate. In the illumination lens according to the present disclosure, the reflection suppression structure for suppressing total reflection of light in the illumination lens is provided in the side end portion and/or the flat portion of the illumination lens, thereby reducing an influence of such unintentional light on a characteristic of the illumination lens, and therefore, according to the present disclosure, it is possible to improve the characteristic of the irradiation light from the illumination lens regardless of usage of the illumination lens.

Further, in the first embodiment to the seventh embodiment described above, the illumination lenses 130 to 730 are used as a lens for capturing an image with a flash in the image pickup module 10, and therefore the convex lens 132 is provided on the lower surface thereof and the Fresnel lens 133 is provided on the upper surface thereof. However, the present disclosure is not limited to such an example. The specific kind of lens provided in the lens portion of the illumination lens according to the present disclosure may be changed as appropriate in accordance with the usage of the illumination lens. The effect that improves the characteristic of the illumination lens by suppressing total reflection on the side end portion and/or the flat portion of the illumination lens can be similarly obtained regardless of the kind of lens. Therefore, according to the present disclosure, it is possible to improve the characteristic of the illumination lens without limiting a shape of the lens to a specific shape of the lens provided in the illumination lens.

Further, the reflection suppression structures described in the first embodiment to the seventh embodiment described above may be combined with each other as much as possible. For example, the scattering structure 635 or the absorption member 735 may be provided on an outer surface of the tapered structure 135, the reverse tapered structure 235, the slope structure 335, the prism structure 435, the protruding cylindrical structure 535a, the recessed cylindrical structure 535b, the protruding triangular prism structure 535c, or the recessed triangular prism structure 535d. As described above, when a reflection suppression structure is provided by combining a plurality of different kinds of configurations, the effect that suppresses total reflection can be further improved by the reflection suppression structure.

Additionally, the present technology may also be configured as below.

(1)

An illumination lens, including:

a lens portion provided in a substantially central portion of a plate surface of a plate-like member;

a flat portion provided in a region other than a region of the lens portion of the plate surface; and a reflection suppression structure configured to suppress total reflection of light inside, the reflection suppression structure being provided in at least one of the flat portion and a side end portion.

(2)

The illumination lens according to (1), wherein the reflection suppression structure transmits light incident on the reflection suppression structure and emits the light toward outside of the illumination lens.

(3)

The illumination lens according to (2), wherein the reflection suppression structure is provided in the side end portion and is a tapered structure in which a thickness of the illumination lens is gradually reduced toward the side end portion at a predetermined taper angle.

(4)

The illumination lens according to (3), wherein the taper angle in the tapered structure is 10 degrees or more.

(5)

The illumination lens according to (2), wherein the reflection suppression structure is provided in the side end portion and is a reverse tapered structure in which a thickness of the illumination lens is gradually increased toward the side end portion at a predetermined taper angle.

(6)

The illumination lens according to (5), wherein the taper angle in the reverse tapered structure is 10 degrees or more.

(7)

The illumination lens according to (2), wherein the reflection suppression structure is provided in the side end portion and is a slope structure in which an end surface of the side end portion is inclined to a thickness direction at a predetermined slope angle.

(8)

The illumination lens according to (7), wherein the slope angle in the slope structure is 10 degrees or more.

(9)

The illumination lens according to (2), wherein the reflection suppression structure is provided in the side end portion and is a prism structure in which an uneven structure inclined to a thickness direction of the illumination lens at a predetermined prism angle is provided with a predetermined pitch.

(10)

The illumination lens according to (9), wherein the prism angle in the prism structure is 10 degrees or more.

(11)

The illumination lens according to (2), wherein the reflection suppression structure is a protruding structure in which the side end portion protrudes toward a side.

(12)
The illumination lens according to (2),
wherein the reflection suppression structure is a recessed structure in which the side end portion is recessed toward a side.
(13)
The illumination lens according to any one of (2) to (12),
wherein the reflection suppression structure is provided in the side end portion and is a scattering structure configured to scatter light from the inside and emit the light toward the outside.
(14)
The illumination lens according to any one of (1) to (13),
wherein the reflection suppression structure absorbs light incident on the reflection suppression structure.
(15)
The illumination lens according to (14)
wherein the reflection suppression structure is provided in the side end portion and is an absorption member configured to absorb incident light.
(16)
The illumination lens according to (15),
wherein the absorption member is any one of light-absorbing resist applied to a side surface of the illumination lens, color filter material laminated on the side surface, and an ND filter provided on the side surface.
(17)
The illumination lens according to any one of (1) to (16),
wherein the lens portion includes a convex lens provided on a light incident surface of the illumination lens and a Fresnel lens provided on a light emission surface of the illumination lens.
(18)
An image pickup module, including:
an illumination unit that includes a light source and an illumination lens and that is arranged on a rear cover so that emitted light from the light source passes through the illumination lens and the rear cover and is emitted toward the outside; and
a camera unit provided so that an objective lens faces the rear cover on a same surface as a surface of the rear cover on which the illumination unit is provided,
wherein the illumination lens includes
a lens portion provided in a substantially central portion of a plate surface of a plate-like member,
a flat portion provided in a region other than a region of the lens portion of the plate surface, and
a reflection suppression structure configured to suppress total reflection of light inside, the reflection suppression structure being provided in at least one of the flat portion and a side end portion.
(19)
An electronic apparatus, including
an image pickup module,
wherein the image pickup module includes
an illumination unit that includes a light source and an illumination lens and that is arranged on a rear cover so that emitted light from the light source is transmitted through the illumination lens and the rear cover and is emitted toward the outside, and
a camera unit provided so that an objective lens of light faces the rear cover on a same surface as a surface of the rear cover on which the illumination unit is provided, and
the illumination lens includes
a lens portion provided in a substantially central portion of a plate surface of a plate-like member,
a flat portion provided in a region other than a region of the lens portion of the plate surface, and
a reflection suppression structure configured to suppress total reflection of light inside, the reflection suppression structure being provided in at least one of the flat portion and a side end portion.

REFERENCE SIGNS LIST 10, 90 image pickup module
110, 190 camera unit
120, 920 light source
130, 230, 330, 430, 530a, 530b, 530c, 530d, 630, 730, 930 illumination lens
140, 940 rear cover
150, 950 reflecting film
160, 960 illumination unit
135 tapered structure
235 reverse tapered structure
335 slope structure
435 prism structure
535a protruding cylindrical structure
535b recessed cylindrical structure
535c protruding triangular prism structure
535d recessed triangular prism structure
635 scattering structure
735 absorption member

What is claimed is:
1. An illumination lens, comprising:
a lens portion provided in a substantially central portion of a plate surface of a plate-like member,
a flat portion provided in a region other than a region of the lens portion of the plate surface, and
a reflection suppression structure configured to suppress total reflection of light inside, the reflection suppression structure being provided in at least one of the flat portion and a side end portion,
wherein the reflection suppression structure transmits light incident on the reflection suppression structure and emits the light toward an outside of the illumination lens, and
wherein the reflection suppression structure is provided in the side end portion and is a reverse tapered structure in which a thickness of the illumination lens is gradually increased toward the side end portion at a predetermined taper angle.
2. The illumination lens according to claim 1,
wherein the predetermined taper angle in the reverse tapered structure is 10 degrees or more.
3. The illumination lens according to claim 1,
wherein the reflection suppression structure is a scattering structure configured to scatter light from the inside and emit the light toward the outside.
4. The illumination lens according to claim 1,
wherein the reflection suppression structure absorbs light incident on the reflection suppression structure.
5. The illumination lens according to claim 4,
wherein the reflection suppression structure is an absorption member configured to absorb incident light.
6. The illumination lens according to claim 5,
wherein the absorption member is any one of a light-absorbing resist applied to a side surface of the illumination lens, a color filter material laminated on the side surface, and an ND filter provided on the side surface.

7. The illumination lens according to claim 1,
wherein the lens portion includes a convex lens provided on a light incident surface of the illumination lens and a Fresnel lens provided on a light emission surface of the illumination lens.

8. An image pickup module, comprising:
an illumination unit that includes a light source and an illumination lens and that is arranged on a rear cover so that emitted light from the light source passes through the illumination lens and the rear cover and is emitted toward an outside; and
a camera unit provided so that an objective lens faces the rear cover on a same surface as a surface of the rear cover on which the illumination unit is provided,
wherein the illumination lens includes:
   a lens portion provided in a substantially central portion of a plate surface of a plate-like member,
   a flat portion provided in a region other than a region of the lens portion of the plate surface, and
   a reflection suppression structure configured to suppress total reflection of light inside, the reflection suppression structure being provided in at least one of the flat portion and a side end portion,
wherein the reflection suppression structure transmits light incident on the reflection suppression structure and emits the light toward the outside of the illumination lens, and
wherein the reflection suppression structure is provided in the side end portion and is a reverse tapered structure in which a thickness of the illumination lens is gradually increased toward the side end portion at a predetermined taper angle.

9. The image pickup module of claim 8, wherein the predetermined taper angle in the reverse tapered structure is 10 degrees or more.

10. The image pickup module of claim 8, wherein the reflection suppression structure is a scattering structure configured to scatter light from the inside and emit the light toward the outside.

11. The image pickup module of claim 8, wherein the reflection suppression structure absorbs light incident on the reflection suppression structure.

12. The image pickup module of claim 11, wherein the reflection suppression structure is an absorption member configured to absorb incident light.

13. The image pickup module of claim 12, wherein the absorption member is any one of a light-absorbing resist applied to a side surface of the illumination lens, a color filter material laminated on the side surface, and an ND filter provided on the side surface.

14. An electronic apparatus, comprising
an image pickup module,
wherein the image pickup module includes
   an illumination unit that includes a light source and an illumination lens and that is arranged on a rear cover so that emitted light from the light source is transmitted through the illumination lens and the rear cover and is emitted toward an outside, and
   a camera unit provided so that an objective lens of light faces the rear cover on a same surface as a surface of the rear cover on which the illumination unit is provided, and
the illumination lens includes:
   a lens portion provided in a substantially central portion of a plate surface of a plate-like member,
   a flat portion provided in a region other than a region of the lens portion of the plate surface, and
   a reflection suppression structure configured to suppress total reflection of light inside, the reflection suppression structure being provided in at least one of the flat portion and a side end portion,
wherein the reflection suppression structure transmits light incident on the reflection suppression structure and emits the light toward the outside of the illumination lens, and
wherein the reflection suppression structure is provided in the side end portion and is a reverse tapered structure in which a thickness of the illumination lens is gradually increased toward the side end portion at a predetermined taper angle.

15. The electronic apparatus of claim 14, wherein the predetermined taper angle in the reverse tapered structure is 10 degrees or more.

16. The electronic apparatus of claim 14, wherein the reflection suppression structure is a scattering structure configured to scatter light from the inside and emit the light toward the outside.

17. The electronic apparatus of claim 14, wherein the reflection suppression structure absorbs light incident on the reflection suppression structure.

18. The electronic apparatus of claim 17, wherein the reflection suppression structure is an absorption member configured to absorb incident light.

19. The electronic apparatus of claim 18, wherein the absorption member is any one of a light-absorbing resist applied to a side surface of the illumination lens, a color filter material laminated on the side surface, and an ND filter provided on the side surface.

20. The electronic apparatus of claim 14, wherein the lens portion includes a convex lens provided on a light incident surface of the illumination lens and a Fresnel lens provided on a light emission surface of the illumination lens.

\* \* \* \* \*